(12) United States Patent
Huang et al.

(10) Patent No.: US 11,843,351 B2
(45) Date of Patent: *Dec. 12, 2023

(54) INTEGRATED CIRCUIT INCLUDING RESONANT CIRCUIT

(71) Applicant: HUAWEI TECHNOLOGIES CO., LTD., Guangdong (CN)

(72) Inventors: Jichao Huang, Shenzhen (CN); Qing Min, Shanghai (CN); Lei Lu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,164

(22) Filed: Aug. 8, 2022

(65) Prior Publication Data

US 2022/0393644 A1 Dec. 8, 2022

Related U.S. Application Data

(63) Continuation of application No. 17/336,967, filed on Jun. 2, 2021, now Pat. No. 11,444,572, which is a continuation of application No. PCT/CN2018/123980, filed on Dec. 26, 2018.

(51) Int. Cl.
*H03B 5/12* (2006.01)

(52) U.S. Cl.
CPC ....... *H03B 5/12* (2013.01); *H03B 2200/0026* (2013.01)

(58) Field of Classification Search
CPC ............ H03B 5/08; H03B 5/12–1231; H03B 5/1237–1275; H03B 5/1296; H03B 2200/0026

USPC ............... 331/46, 56, 167, 117 FE, 117 R
See application file for complete search history.

(56) References Cited

U.S. PATENT DOCUMENTS

| 7,336,135 B2 | 2/2008 | Higashi et al. |
| 8,294,528 B2 | 10/2012 | Li et al. |
| 8,686,805 B2 | 4/2014 | Nylén |
| 9,484,858 B1 | 11/2016 | Kalia et al. |

(Continued)

FOREIGN PATENT DOCUMENTS

| CN | 101621253 | 1/2010 |
| CN | 101652013 | 2/2010 |

(Continued)

OTHER PUBLICATIONS

Extended European Search Report issued in European Application No. 18944981.2 dated Oct. 19, 2021, 7 pages.

(Continued)

*Primary Examiner* — Levi Gannon
(74) *Attorney, Agent, or Firm* — Fish & Richardson P.C.

(57) ABSTRACT

The present disclosure relates to integrated circuits. One example integrated circuit includes a first resonant circuit, a second resonant circuit, and at least one connection circuit. The first resonant circuit includes a first inductor, and the second resonant circuit includes a second inductor. The first inductor includes a first port, and the second inductor includes a second port. The at least one connection circuit is connected between the first port and the second port. The at least one connection circuit provides an electrical connection between the first port and the second port.

20 Claims, 16 Drawing Sheets

(56) References Cited

U.S. PATENT DOCUMENTS

| | | |
|---|---|---|
| 2004/0251975 A1 | 12/2004 | Li et al. |
| 2005/0242915 A1 | 11/2005 | Dolmans et al. |
| 2007/0268007 A1 | 11/2007 | Rai |
| 2009/0289727 A1 | 11/2009 | Rai |
| 2011/0050354 A1 | 3/2011 | Hirashiki et al. |
| 2011/0057732 A1 | 3/2011 | Taylor et al. |
| 2011/0241788 A1 | 10/2011 | Jang et al. |
| 2012/0154060 A1 | 6/2012 | Chang et al. |
| 2013/0009715 A1 | 1/2013 | Chang et al. |
| 2013/0099870 A1 | 4/2013 | Terrovitis |
| 2015/0130545 A1* | 5/2015 | Chen .................. H03L 7/00 331/55 |
| 2015/0295535 A1 | 10/2015 | Shi et al. |
| 2017/0104453 A1 | 4/2017 | Iotti et al. |
| 2017/0141728 A1 | 5/2017 | Chen |
| 2018/0277301 A1 | 9/2018 | Mika |

FOREIGN PATENT DOCUMENTS

| | | |
|---|---|---|
| CN | 101662260 | 3/2010 |
| CN | 105306040 | 2/2016 |
| CN | 105488443 | 4/2016 |
| CN | 106712517 | 5/2017 |
| CN | 107017843 | 8/2017 |
| EP | 2201676 | 6/2010 |
| JP | 2014099309 A | 5/2014 |
| WO | WO2003005559 | 1/2003 |

OTHER PUBLICATIONS

IEEE P802.11ax/D2.2, "Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Enhancements for High Efficiency WLAN," Feb. 2018, 620 pages.

Office Action issued in Chinese Application No. 201880099174.4 dated Nov. 30, 2021, 8 pages.

PCT International Search Report and Written Opinion issued in International Application No. PCT/CN2018/123980 dated Aug. 14, 2019, 15 pages (with English translation).

Office Action in Chinese Appln. No. 201880099174.4, dated Nov. 30, 2021, 15 pages (with English translation).

* cited by examiner

INTEGRATED CIRCUIT INCLUDING RESONANT CIRCUIT

CROSS-REFERENCE TO RELATED APPLICATIONS

This application is a continuation of U.S. patent application Ser. No. 17/336,967, filed on Jun. 2, 2021, which is a continuation of International Application No. PCT/CN2018/123980, filed on Dec. 26, 2018. All of the afore-mentioned patent applications are hereby incorporated by reference in their entireties.

TECHNICAL FIELD

This application relates to the field of electronic circuits, and in particular, to an integrated circuit including a resonant circuit.

BACKGROUND

At present, in the field of integrated circuits, higher requirements are imposed on stability of a working frequency of a resonant circuit, and it is usually expected that the resonant circuit oscillates only at a specified frequency. However, a distance between components in the integrated circuit becomes shorter, and some components even overlap, to save a layout area to improve an integration level of the integrated circuit. This greatly increases coupling and interference between the components, and reduces the stability of the working frequency of the integrated circuit. Herein, coupling between two inductors belonging to two resonant circuits that are close to each other is used as an example for description. Magnetic lines of force generated by current flow directions between the two inductors may be in a same direction or may be in opposite directions. As a result, both positive mutual inductance and negative mutual inductance exist between the two inductors; consequently, two oscillation modes may exist between the resonant circuits. However, the two oscillation modes may make the resonant circuit to oscillate at a frequency other than the specified frequency. As a result, the integrated circuit cannot work normally, and the stability of the working frequency of the resonant circuit is seriously reduced.

How to make the resonant circuit oscillate only at the specified frequency to improve the stability of the working frequency of the resonant circuit is of great significance.

SUMMARY

Embodiments of this application provide an integrated circuit including a resonant circuit, to improve stability of a working frequency of the resonant circuit in the integrated circuit.

According to a first aspect of this application, an integrated circuit is provided. The integrated circuit includes a first resonant circuit, a second resonant circuit, and at least one connection circuit. The first resonant circuit includes a first inductor, and the second resonant circuit includes a second inductor. The first inductor includes a first port and a second port, and the second inductor includes a third port and a fourth port. The at least one connection circuit is connected between at least one of the first port and the second port and at least one of the third port and the fourth port. A connection circuit is configured to provide an electrical connection between two ports connected to the connection circuit.

The integrated circuit provided in this embodiment of this application includes two resonant circuits adjacent to each other and a connection circuit. The two resonant circuits each include one inductor. The connection circuit is connected between corresponding ports of the two inductors. The connection circuit enables an electrical connection between the corresponding ports of the two inductors. This reduces or suppresses a reverse-phase oscillation mode or an in-phase oscillation mode of the two resonant circuits, so that there is only one oscillation mode between the two resonant circuits, thereby improving stability of a working frequency of the resonant circuit. It should be understood that, when a co-grounded connection does not exist between the two inductors, the first port and the second port each include an interface at any part of the first inductor, and the third port and the fourth port each include an interface at any part of the second inductor. When a co-grounded connection exists between the two inductors, the first port and the second port each include an interface at a non-co-grounded connection part of the first inductor, and the third port and the fourth port each include an interface at a non-co-grounded connection part of the second inductor. The connection between the at least one of the first port and the second port and the at least one of the third port and the fourth port does not include the co-grounded connection. It should be understood that the non-co-grounded connection part is a part of the inductor other than a part in which the co-grounded connection exists.

In a possible implementation, the first port, the second port, the third port, and the fourth port are input ports or output ports of signals.

In a possible implementation, the first port and the second port are differential ports, and the third port and the fourth port are differential ports.

In a possible implementation, the connection circuit is not grounded.

Optionally, the ground includes a direct current ground or an alternating current ground.

In a possible implementation, all the first port, the second port, the third port, and the fourth port are non-grounded ports. Correspondingly, a connection between any two ports is a non-grounded connection.

In a possible implementation, the at least one of the first port and the second port of the first inductor is short-circuited with the at least one of the third port and the fourth port of the second inductor by using the connection circuit.

In a possible implementation, the connection circuit is made of a superconducting material, and the at least one of the first port and the second port of the first inductor is short-circuited with the at least one of the first port and the second port of the second inductor by using the superconducting material.

The connection circuit may also be another material without resistance, so that corresponding ports are short-circuited.

In a possible implementation, the connection circuit is a metal connection wire. The metal connection wire includes one or more layers of metal layer connection wires.

In a possible implementation, the connection circuit includes at least one of a resistor, an inductor, and a capacitor.

In a possible implementation, the resistor, the inductor, and the capacitor may be implemented by an on-chip resistor, an on-chip inductor, and an on-chip capacitor. In addition, a metal connection wire of each metal layer of a chip may also be used for implementation. The metal connection wire may also be referred to as a metal cable or a metal wire. For example, when the metal cable or the metal wire is thin and long, the metal cable or the metal wire has resistance and inductance, and therefore can be used as a resistor or an inductor. For example, the on-chip resistor may include a metal, a polycrystalline silicon resistor, a conducted metal-oxide-semiconductor (MOS) transistor, and the like. The on-chip capacitor may include a metal oxide metal (MOM) capacitor, a metal insulator metal (MIM) capacitor, or a MOS capacitor. The on-chip inductor may include a metal, for example, may be a metal wire. Based on different shapes, the on-chip inductor can be classified into an octagonal inductor, a ring inductor, an octagonal inductor, and the like. Based on symmetry, the on-chip inductor can be classified into a differential inductor and a single-ended inductor. Based on whether there is a tap, the on-chip inductor can be classified into a tap inductor and a non-tap inductor.

In a possible implementation, the first resonant circuit is a first digitally controlled oscillator (DCO) core, and the second resonant circuit is a second DCO core.

In a possible implementation, the first resonant circuit is a first voltage controlled oscillator (VCO) core, and the second resonant circuit is a second VCO core.

In a possible implementation, layouts of the first inductor and the second inductor meet the following condition: when flow directions of the signals in the first inductor and the second inductor enable positive mutual inductance between the first inductor and the second inductor, at a same moment, both the first port and the third port are input ports of the signals, or both the first port and the third port are output ports of the signals; or when flow directions of the signals in the first inductor and the second inductor enable negative mutual inductance between the first inductor and the second inductor, at a same moment, both the first port and the fourth port are input ports of the signals, or both the first port and the fourth port are output ports of the signals.

When positive mutual inductance exists between the first inductor and the second inductor, the two inductors work in an in-phase mode, and both the first port and the third port are the input ports of the signals or are the output ports of the signals. When negative mutual inductance exists between the first inductor and the second inductor, the two inductors work in a reverse-phase mode, and both the first port and the fourth port are the input ports of the signals or are the output ports of the signals.

In a possible implementation, layouts of the first inductor and the second inductor meet the following condition: when both flow directions of signals in the first inductor and the second inductor are clockwise or counterclockwise, at a same moment, the first port is an input port of the signal and the third port is an output port of the signal; or at a same moment, the first port is an output port of the signal, the third port is an input port of the signal, a phase of the signal on the first port is reverse to a phase of the signal on the third port, and a phase of the signal on the second port is reverse to a phase of the signal on the fourth port.

In this possible implementation, ports of the first inductor and ports of the second inductor face different directions. For example, the ports of the first inductor and the ports of the second inductor face opposite directions. For example, the ports of the first inductor face a right side, and the ports of the second inductor face a left side.

In a possible implementation, layouts of the first inductor and the second inductor meet the following condition: when a flow direction of a signal in the first inductor is clockwise and a flow direction of a signal in the second inductor is counterclockwise, or when a flow direction of a signal in the first inductor is counterclockwise and a flow direction of a signal in the second inductor is clockwise, at a same moment, both the first port and the third port are output ports of the signals or input ports of the signals, a phase of the signal on the first port is the same as a phase of the signal on the third port, and a phase of the signal on the second port is the same as a phase of the signal on the fourth port.

In this possible implementation, ports of the first inductor and ports of the second inductor face different directions. For example, the ports of the first inductor and the ports of the second inductor face opposite directions. For example, the ports of the first inductor faces a right side, and the ports of the second inductor faces a left side.

In a possible implementation, layouts of the first inductor and the second inductor meet the following condition: when both flow directions of signals in the first inductor and the second inductor are clockwise or counterclockwise, at a same moment, both the first port and the third port are input ports of the signals or output ports of the signals.

In this possible implementation, ports of the first inductor and ports of the second inductor face a same direction. For example, the first inductor and the second inductor may be two completely overlapping induction coils located at different metal layers, or may be a large inductor and a small inductor, where the small inductor is sleeved inside the large inductor.

In a possible implementation, layouts of the first inductor and the second inductor meet the following condition: when a flow direction of a signal in the first inductor is clockwise and a flow direction of a signal in the second inductor is counterclockwise, or when a flow direction of a signal in the first inductor is counterclockwise and a flow direction of a signal in the second inductor is clockwise, at a same moment, the first port is an input port of the signal, and the third port is an output port of the signal; or at a same moment, the first port is an output port of the signal, and the third port is an input port of the signal.

In this possible implementation, ports of the first inductor and ports of the second inductor face a same direction. For example, the first inductor and the second inductor may be two completely overlapping induction coils located at different metal layers, or may be a large inductor and a small inductor, where the small inductor is sleeved inside the large inductor.

In a possible implementation, both the two ports connected to the connection circuit are input ports of the signals or output ports of the signals.

In a possible implementation, a connection circuit is connected between the first port and the third port.

In this connection mode, the first port and the third port are always the input ports of the signals, or the first port and the third port are always the output ports of the signals, thereby suppressing a reverse-phase oscillation mode between the first inductor and the second inductor.

In a possible implementation, a connection circuit is connected between the second port and the fourth port.

In this connection mode, the second port and the fourth port are always the input ports of currents, or the second port and the fourth port are always the output ports of currents, thereby suppressing a reverse-phase oscillation mode between the first inductor and the second inductor.

In a possible implementation, a connection circuit is connected between the first port and the third port and a connection circuit is connected between the second port and the fourth port.

In this connection mode, the first port and the third port are always the input ports of the signals, and the second port and the fourth port are always the output ports of the signals; or the first port and the third port are always the output ports of the signals, and the second port and the fourth port are always the input ports of the currents, thereby suppressing a reverse-phase oscillation mode between the first inductor and the second inductor.

In a possible implementation, the at least one connection circuit includes a first connection circuit and a second connection circuit, and the first connection circuit is different from the second connection circuit. The first connection circuit is connected between the first port and the third port, and the second connection circuit is connected between the second port and the fourth port.

In this connection mode, the first port and the third port are always the input ports of the signals, and the second port and the fourth port are always the output ports of the signals; or the first port and the third port are always the output ports of the signals, and the second port and the fourth port are always the input ports of the currents, thereby suppressing a reverse-phase oscillation mode between the first inductor and the second inductor.

In a possible implementation, a connection circuit is connected between the first port and the fourth port, or a connection circuit is connected between the second port and the third port.

In this connection mode, the first port and the fourth port are always the input ports of currents or are always the output ports of currents; or the second port and the third port are always the input ports of currents or are always the output ports of currents, thereby suppressing an in-phase oscillation mode between the first inductor and the second inductor.

In a possible implementation, a connection circuit is connected between the first port and the fourth port and a connection circuit is connected between the second port and the third port.

In this connection mode, the first port and the fourth port are always the input ports of the signals, and the second port and the third port are always the output ports of the signals; or the first port and the fourth port are always the output ports of the signals, and the second port and the third port are always the input ports of the currents, thereby suppressing an in-phase oscillation mode between the first inductor and the second inductor.

In a possible implementation, the connection circuit includes a first connection circuit and a second connection circuit, and the first connection circuit is different from the second connection circuit. The first connection circuit is connected between the first port and the fourth port, and the second connection circuit is connected between the second port and the third port.

In this connection mode, the first port and the fourth port are always the input ports of the signals, and the second port and the third port are always the output ports of the signals; or the first port and the fourth port are always the output ports of the signals, and the second port and the third port are always the input ports of the currents, thereby suppressing an in-phase oscillation mode between the first inductor and the second inductor.

In a possible implementation, the signal includes at least one of a current signal or a voltage signal.

In a possible implementation, the capacitor includes an on-chip capacitor, a diode, a MOS transistor, or a varactor.

In a possible implementation, the first VCO core further includes a first negative resistor and a first parallel resistor, and the second VCO core further includes a second negative resistor and a second parallel resistor. The first negative resistor and the first parallel resistor are connected in parallel to two ports of the first inductor, and the second negative resistor and the second parallel resistor are connected in parallel to two ports of the second inductor.

In a possible implementation, the connection circuit includes a resistor, and a resistance value of the resistor is less than a first preset threshold, so that the first resonant circuit and the second resonant circuit do not meet an oscillation startup condition at a reverse-phase oscillation frequency or an in-phase oscillation frequency.

The resistor in the connection circuit may reduce an equivalent parallel resistance value of the two inductors in the two resonant circuits in the reverse-phase mode or the in-phase mode. When the resistance value is less than the preset threshold, the two resonant circuits do not meet the oscillation startup condition in the reverse-phase mode or the in-phase mode. It should be understood that the equivalent parallel resistor herein does not include a negative resistor −gm. In this embodiment of this application, the resistor that is connected in parallel to the two ports of the inductor of the VCO core does not include the negative resistor −gm. The negative resistor mentioned in this embodiment of this application is not considered as a type of resistor.

In a possible implementation, the connection circuit includes a resistor, and when the resistor is connected between the first port and the third port and when the resistor is connected between the second port and the fourth port, a resistance value of the resistor is less than a first preset threshold, so that the first resonant circuit and the second resonant circuit do not meet an oscillation startup condition at a reverse-phase oscillation frequency.

In a possible implementation, the connection circuit includes a resistor, and when the resistor is connected between the first port and the fourth port and when the resistor is connected between the second port and the third port, a resistance value of the resistor is less than a first preset threshold, so that the first resonant circuit and the second resonant circuit do not meet an oscillation startup condition at an in-phase oscillation frequency.

In a possible implementation, the first connection circuit includes a first resistor R1, a first connection inductor L1, and a first capacitor C1. The second connection circuit includes a second resistor R2, a second connection inductor L2, and a second capacitor C2. L1, L2, C1, and C2 meet $$\omega = \frac{1}{\sqrt{L'C'}}.$$

L'=(L1+L2)/2, and C'=(2*C1*C2)/(C1+C2). w is an oscillation frequency of the first VCO core and the second VCO core when both flow directions of signals in the first inductor and the second inductor are clockwise or counterclockwise.

When the connection inductor and the capacitor in the connection circuit are set to proper values, a resonance frequency of an LC resonance network in an RLC circuit formed by equivalently connecting in parallel to two ports of the first inductor and a resonance frequency of an LC resonance network in an RLC circuit formed by equivalently connecting in parallel to two ports of the second inductor in the reverse-phase mode each are equal to the reverse-phase oscillation frequency of the two VCO cores, so that in the reverse-phase mode, an LC impedance of the RLC circuit connected in parallel to two ports of one of the two inductors is 0, an LC impedance of the RLC circuit connected in parallel to two ports of the other of the two inductors is 0, and only a resistor is left.

In a possible implementation, a difference between w and the reverse-phase oscillation frequency of the two VCO cores is less than a preset threshold.

When w is not strictly equal to the reverse-phase oscillation frequency of the two VCO cores, the reverse-phase oscillation mode of the two VCO cores may also be reduced or suppressed.

In a possible implementation, $$\frac{Rp * R\prime}{Rp + R\prime} * gm \leq 1.$$

R'=(R1+R2)/2, Rp is the first parallel resistor, and gm is a resistance value of the first negative resistor.

When the resistor in the connection circuit is set to a proper value, generally, when a resistance value in the connection circuit is less than a preset threshold, the two VCO cores do not meet the oscillation startup condition in the reverse-phase mode.

In a possible implementation, a first decoupling network includes a first resistor R1 and a first decoupling inductor C1, a second decoupling network includes a second resistor R2 and a second decoupling inductor C2, and R1 and R2 meet the following conditions:

$$\frac{Rp * R\prime}{Rp + R\prime} * gm \leq 1.$$

R'=(R1+K2)/2, Rp is the first parallel resistor, and gm is a resistance value of the first negative resistor.

When the resistor and the inductor are connected between the two inductors, equivalent parallel resistance values of the two inductors in the reverse-phase mode may be reduced, so that the two VCO cores do not meet the oscillation startup condition in the reverse-phase mode.

In a possible implementation, an inductance value of the first inductor is equal to an inductance value of the second inductor.

In a possible implementation, the first inductor and the second inductor are adjacent but do not intersect, the first inductor and the second inductor partially overlap, or the first inductor and the second inductor completely overlap.

In a possible implementation, the connection circuit includes a resistor, an inductor, a first diode, and a second diode.

DESCRIPTION OF EMBODIMENTS

In the embodiments, claims, and the accompanying drawings of this specification in this application, the terms "first", "second", and the like are intended to distinguish between similar objects, but do not necessarily indicate a specific order or sequence. In addition, the terms "include", "have", and any variant thereof are intended to cover the non-exclusive inclusion, for example, include a series of steps or units. A method, system, product, or device is not necessarily limited to those steps or units that are clearly listed, but may include other steps or units that are not clearly listed or inherent to such a process, method, product, or device.

It should be understood that, in this application, "at least one" means one or more, and "a plurality of" means two or more. The term "and/or" is used to describe an association relationship for describing associated objects, and indicates that three relationships may exist. For example, "A and/or B" may represent the following three cases: Only A exists, only B exists, and both A and B exist, where A and B may be singular or plural. The character "/" generally indicates an "or" relationship between the associated objects. "At least one of the following items (pieces)" or a similar expression thereof indicates any combination of these items, including a single item (piece) or any combination of a plurality of items (pieces). For example, at least one of a, b, or c may indicate a, b, c, "a and b", "a and c", "b and c", or "a, b, and c", where a, b, and c may be singular or plural.

When an integrated circuit includes two or more resonant circuits, because of high integration of the integrated circuit, a distance between the two or more resonant circuits in the integrated circuit is very short. This greatly increases coupling and interference between the resonant circuits, and affects stability of an oscillation frequency between the resonant circuits. The embodiments of this application provide a connection circuit, so that there is only one oscillation mode between resonant circuits, and the resonant circuit oscillates only at a specified frequency.

Figure 1A:
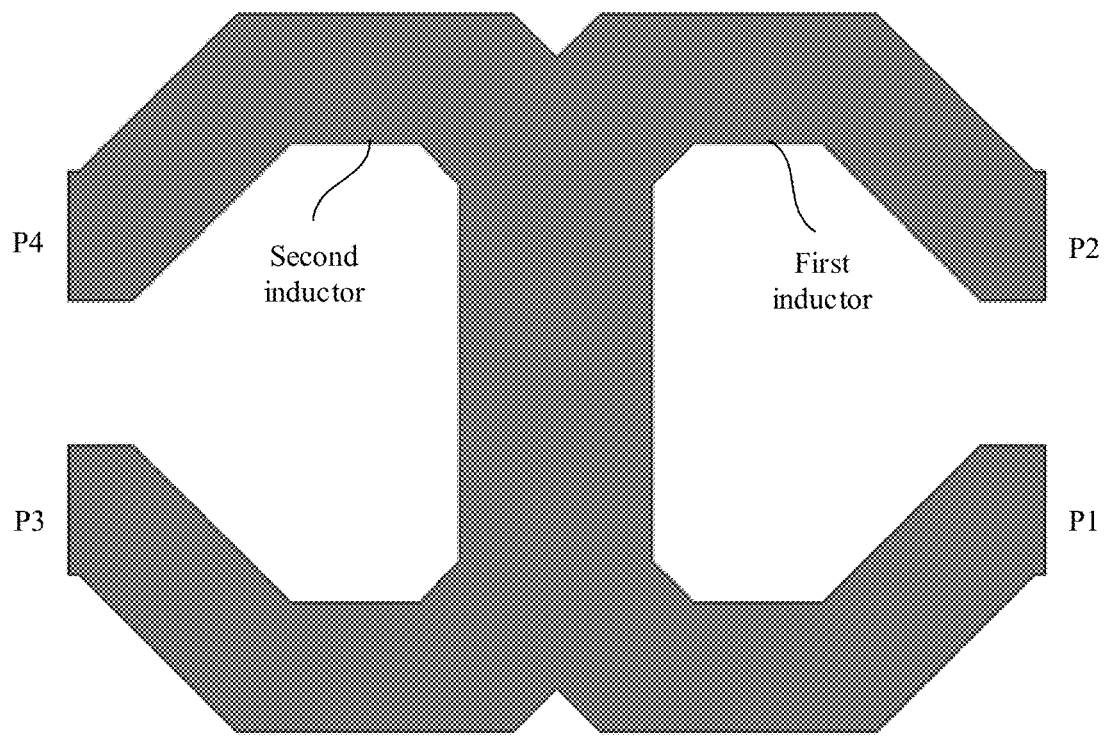
FIG. 1a is a schematic layout diagram of an example of a dual-inductor structure in an integrated circuit according to an embodiment of this application.

The following uses a dual-inductor structure as an example to describe an oscillation mode between two resonant circuits that are close to each other. Each resonant circuit includes one inductor, and two inductors in the two resonant circuits are very close to each other. Optionally, the two inductors may partially overlap. It should be understood that the integrated circuit may include three or more inductors. This is not limited in the embodiments of this application. FIG. 1a is a schematic layout diagram of an example of a dual-inductor structure in an integrated circuit according to an embodiment of this application. The integrated circuit includes a first inductor and a second inductor. The first inductor is an inductor in a first resonant circuit, and the second inductor is an inductor in a second resonant circuit. It should be understood that, although not shown, the integrated circuit may further include another component, for example, a resistor, a capacitor, or another inductor other than the dual-inductor structure. The dual-inductor structure is directly or indirectly connected to the another component of the integrated circuit.

Figure 1B:
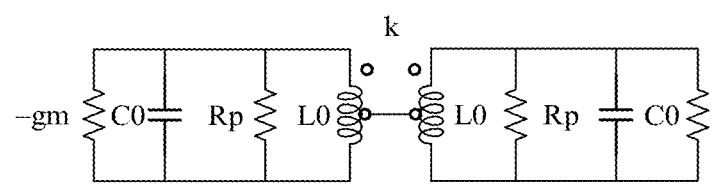
FIG. 1B is a schematic circuit diagram of an example of a simplified resistor, inductor, and capacitor RLC model of a dual-inductor structure in an integrated circuit according to an embodiment of this application.

The first inductor includes two ports: a first port P1 and a second port P2. Correspondingly, the second inductor also includes two ports: a third port P3 and a fourth port P4. It should be understood that, when the dual-inductor structure works in an alternating current mode, flow directions of signals inside the first inductor and the second inductor change. The first inductor is used as an example. The signal may flow from P1 to P2, or may flow from P2 to P1. As shown in FIG. 1B, an electrical connection at an overlapping part between the first inductor and the second inductor in FIG. 1a may be equivalent to a co-grounded connection between a middle position between P1 and P2 and a middle position between P3 and P4. It should be understood that if the connection at the overlapping part between the first inductor and the second inductor is the co-grounded connection, the overlapping part may be equivalent to a ground. For example, the ground may be an alternating current ground or a direct current ground. The overlapping part between the first inductor and the second inductor is a co-grounded connection part, and non-overlapping parts between the first inductor and the second inductor are non-co-grounded connection parts. In addition, P1, P2, P3, and P4 are input or output ports of signals. P1 and P2 are differential ports, and P3 and P4 are differential ports. Alternatively, it may be considered that P1, P2, P3, and P4 are non-grounded ports, and the non-grounded port is a port other than the ground.

When a co-grounded connection does not exist between the two inductors, the first port and the second port each may be an interface at any part of the first inductor, and the third port and the fourth port each may be an interface at any part of the second inductor. When a co-grounded connection exists between the two inductors, the first port and the second port each may be an interface at a non-co-grounded connection part of the first inductor, and the third port and the fourth port each may be an interface at a non-co-grounded connection part of the second inductor. For example, when two inductors located at a same metal layer have an overlapping part, a connection at the overlapping part is considered as a co-grounded connection, and the overlapping part is a co-grounded connection part. In this case, the first port and the second port are ports at a non-overlapping part of the first inductor, the third port and the fourth port are ports of a non-overlapping part of the second inductor, and a connection between any one of the first port and the second port and any one of the third port and the fourth port is not the co-grounded connection. The port may be an interface led out from an induction coil, or may be an interface located on an induction coil.

Figure 1C:
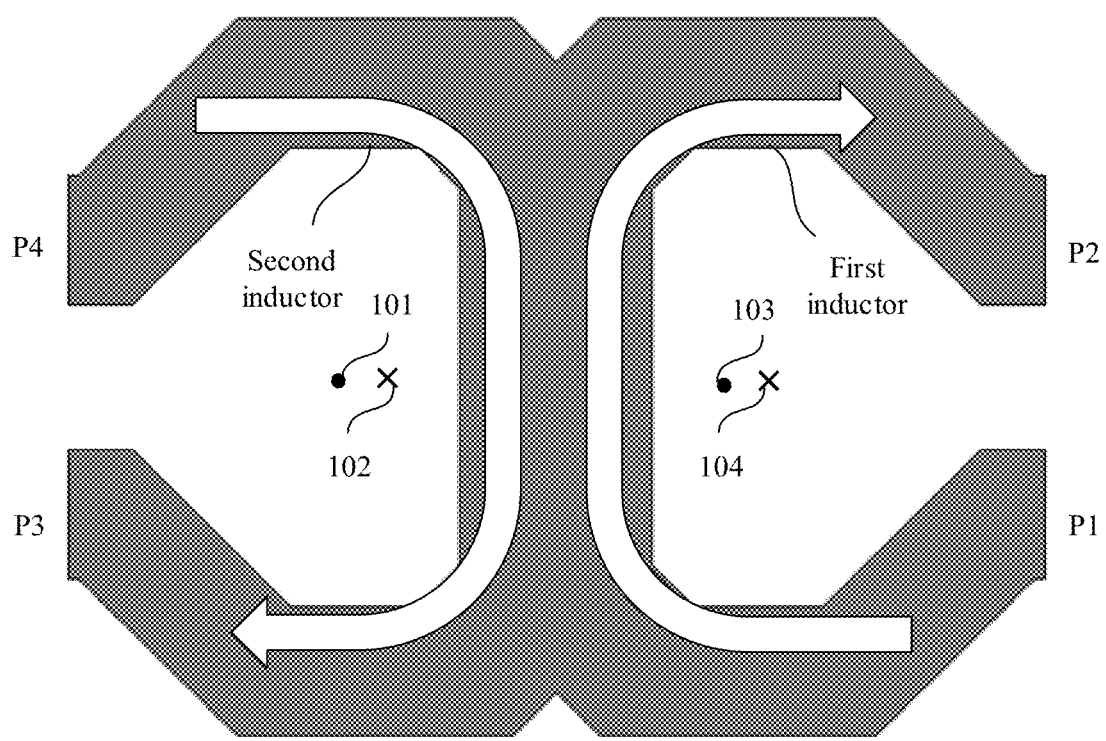
FIG. 1c is a schematic diagram of an example of a current flow direction and a direction of magnetic lines of force at a moment in a dual-inductor structure according to an embodiment of this application.
Figure 1D:
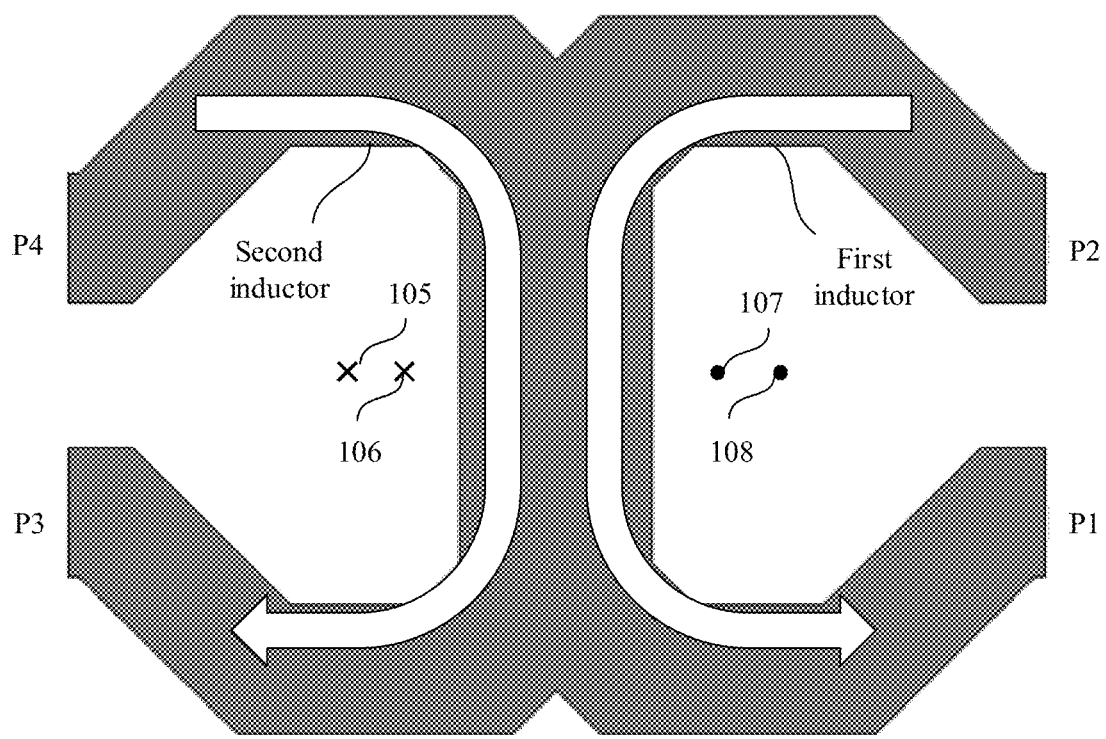
FIG. 1d is a schematic diagram of another example of a current flow direction and a direction of magnetic lines of force at a moment in a dual-inductor structure according to an embodiment of this application.

When a current in the first inductor flows from P1 to P2, and a current in the second inductor flows from P3 to P4 at a same moment; or when a current in the first inductor flows from P2 to P1, and a current in the second inductor flows from P4 to P3 at a same moment, magnetic lines of force generated by the first inductor inside a second induction coil and magnetic lines of force generated by the second inductor are in a same direction, and magnetic lines of force generated by the second inductor inside a first induction coil and magnetic lines of force generated by the first inductor are also in a same direction. In this case, magnetic field intensity of the magnetic lines of force generated by the first inductor and magnetic field intensity of the magnetic lines of force generated by the second inductor are mutually strengthened inside the first induction coil and the second induction coil, and positive mutual inductance is generated between the two inductors, that is, k>0, where k is a mutual inductance coefficient between the two inductors. In this case, when the first inductor and the second inductor work in an in-phase mode, the first resonant circuit and the second resonant circuit also work in an in-phase mode, an oscillation mode between the first resonant circuit and the second resonant circuit is an in-phase oscillation mode, and an oscillation frequency in the in-phase oscillation mode is an in-phase oscillation frequency. FIG. 1*d* is a schematic diagram of a current flow direction and a direction of magnetic lines of force at a moment in a dual-inductor structure according to an embodiment of this application. In this case, the two inductors work in an in-phase mode.

P2 is an input port of a current in a first inductor, P1 is an output port of the current, P4 is an input port of a current in a second inductor, and P3 is an output port of the current. A flow direction of the current in the first inductor is counter-clockwise, and a flow direction of the current in the second inductor is clockwise. As shown in the figure, 105 indicates that magnetic lines of force generated by the first inductor inside a second induction coil are perpendicular inward to a plane on which the inductor is located, and 106 indicates that magnetic lines of force generated by the second inductor inside the second induction coil are perpendicular inward to the plane on which the inductor is located. In this case, the magnetic lines of force 105 and the magnetic lines of force 106 are in a same direction. 107 indicates that magnetic lines of force generated by the second inductor inside a first induction coil are perpendicular outward to the plane on which the inductor is located, and 108 indicates that magnetic lines of force generated by the first inductor inside the first induction coil are perpendicular outward to the plane on which the inductor is located. In this case, the magnetic lines of force 107 and the magnetic lines of force 108 are in a same direction. In other words, the magnetic lines of force generated by the first inductor inside the second induction coil and the magnetic lines of force generated by the second inductor are in a same direction, and the magnetic lines of force generated by the second inductor inside the first induction coil and the magnetic lines of force generated by the first inductor are also in a same direction. In this case, magnetic field intensity of the magnetic lines of force generated by the first inductor and magnetic field intensity of the magnetic lines of force generated by the second inductor are mutually strengthened inside the first induction coil and the second induction coil. It should be understood that, that the flow direction of the current mentioned in this embodiment of this application is clockwise or counterclockwise is for a same reference system.

When a current in the first inductor flows from P1 to P2, and a current in the second inductor flows from P4 to P3 at a same moment; or when a current in the first inductor flows from P2 to P1, and a current in the second inductor flows from P3 to P4 at a same moment, magnetic lines of force generated by the first inductor inside a second induction coil and magnetic lines of force generated by the second inductor are in opposite directions, and magnetic lines of force generated by the second inductor inside a first induction coil and magnetic lines of force generated by the first inductor are also in opposite directions. In this case, magnetic field intensity of the magnetic lines of force generated by the first inductor and magnetic field intensity of the magnetic lines of force generated by the second inductor are mutually weakened inside the first induction coil and the second induction coil, and negative mutual inductance is generated between the two inductors, that is, k<0. In this case, when the first inductor and the second inductor work in a reverse-phase mode, the first resonant circuit and the second resonant circuit also work in a reverse-phase mode, an oscillation mode between the first resonant circuit and the second resonant circuit is a reverse-phase oscillation mode, and an oscillation frequency in the reverse-phase oscillation mode is a reverse-phase oscillation frequency. FIG. 1*c* is a schematic diagram of a current flow direction and a direction of magnetic lines of force at a moment in another dual-inductor structure according to an embodiment of this application. In this case, two inductors work in a reverse-phase mode.

P1 of a first inductor is an input port of a current, P2 is an output port of the current, and a flow direction of the current in the first inductor is clockwise. P3 of a second inductor is an output port of a current, and P4 is an input port of the current, and a flow direction of the current in the second inductor is clockwise. As shown in the figure, 101 indicates that magnetic lines of force generated by the first inductor inside a second induction coil are perpendicular outward to a plane on which the inductor is located, and 102 indicates magnetic lines of force generated by the second inductor inside the second induction coil perpendicular inward to the plane on which the inductor is located. In this case, the magnetic lines of force 101 and the magnetic lines of force 102 are in opposite directions. 103 indicates magnetic lines of force generated by the second inductor inside a first induction coil perpendicular outward to the plane on which the inductor is located, and 104 indicates magnetic lines of force generated by the first inductor inside the first induction coil perpendicular inward to the plane on which the inductor is located. In this case, the magnetic lines of force 103 and the magnetic lines of force 104 are in opposite directions. In other words, the magnetic lines of force generated by the first inductor inside the second induction coil and the magnetic lines of force generated by the second inductor are in opposite directions, and the magnetic lines of force generated by the second inductor inside the first induction coil and the magnetic lines of force generated by the first inductor are also in opposite directions. In this case, magnetic field intensity of the magnetic lines of force generated by the first inductor and magnetic field intensity of the magnetic lines of force generated by the second inductor are mutually weakened inside the first induction coil and the second induction coil.

When the first inductor and the second inductor work in an in-phase mode, phases of voltages in P1 and P3 are the same, and a phase difference between the voltages in P1 and P3 is 0°. In this case, phases of voltages in P2 and P4 are the same, and a phase difference between the voltages in P2 and P4 is 0°. In an optional case, when the phase difference between the voltages in P1 and P3 is not 0°, but the phase difference is less than a first preset threshold, it may also be considered that phases of the voltages in P1 and P3 are the same. This case is also applied to P2 and P4. When the first inductor and the second inductor work in a reverse-phase mode, phases of voltages in P1 and P3 are reversed. For example, a phase difference between the voltages in P1 and P3 is 180°. Phases of voltages in P2 and P4 are reversed. For example, a phase difference between the voltages in P2 and P4 is 180°. In an optional case, when the phase difference between the voltages in P1 and P3 is not 180°, but the phase difference between the voltages in P1 and P3 is greater than a second preset threshold, it may also be considered that phases of the voltages in P1 and P3 are reversed. This case is also applied to P2 and P4. A current signal and a voltage signal each include two components: an amplitude and a phase. The phase herein refers to a phase of a signal inside an induction coil. The foregoing uses the phase of the voltage as an example for description, and uses a current as an example to describe the flow direction of the signal. Actually, the signal may also be a signal of another type.

In this embodiment of this application, layouts of the first inductor and the second inductor meet the following condition: When flow directions of the signals in the first inductor and the second inductor enable positive mutual inductance between the first inductor and the second inductor, at a same moment, both the first port and the third port are input ports of the signals or output ports of the signals; or when flow directions of the signals in the first inductor and the second inductor enable negative mutual inductance between the first inductor and the second inductor, at a same moment, both the first port and the fourth port are input ports of the signals or output ports of the signals. In other words, at a same moment, the first port is an input port of the signal, and the third port is an output port of the signal, or at a same moment, the first port is an output port of the signal, and the third port is an input port of the signal.

Alternatively, layouts of the first inductor and the second inductor meet the following condition: When both the first port and the third port are input ports of signals or output ports of signals, flow directions of the signals in the first inductor and the second inductor enable the first inductor and the second inductor to generate positive mutual inductance; or when both the first port and the fourth port are input ports of signals or output ports of signals, or when one of the first port and the third port is an input port of the signal, and the other port is an output port of the signal, flow directions of the signals in the first inductor and the second inductor enable the first inductor and the second inductor to generate negative mutual inductance.

Figure 1E:
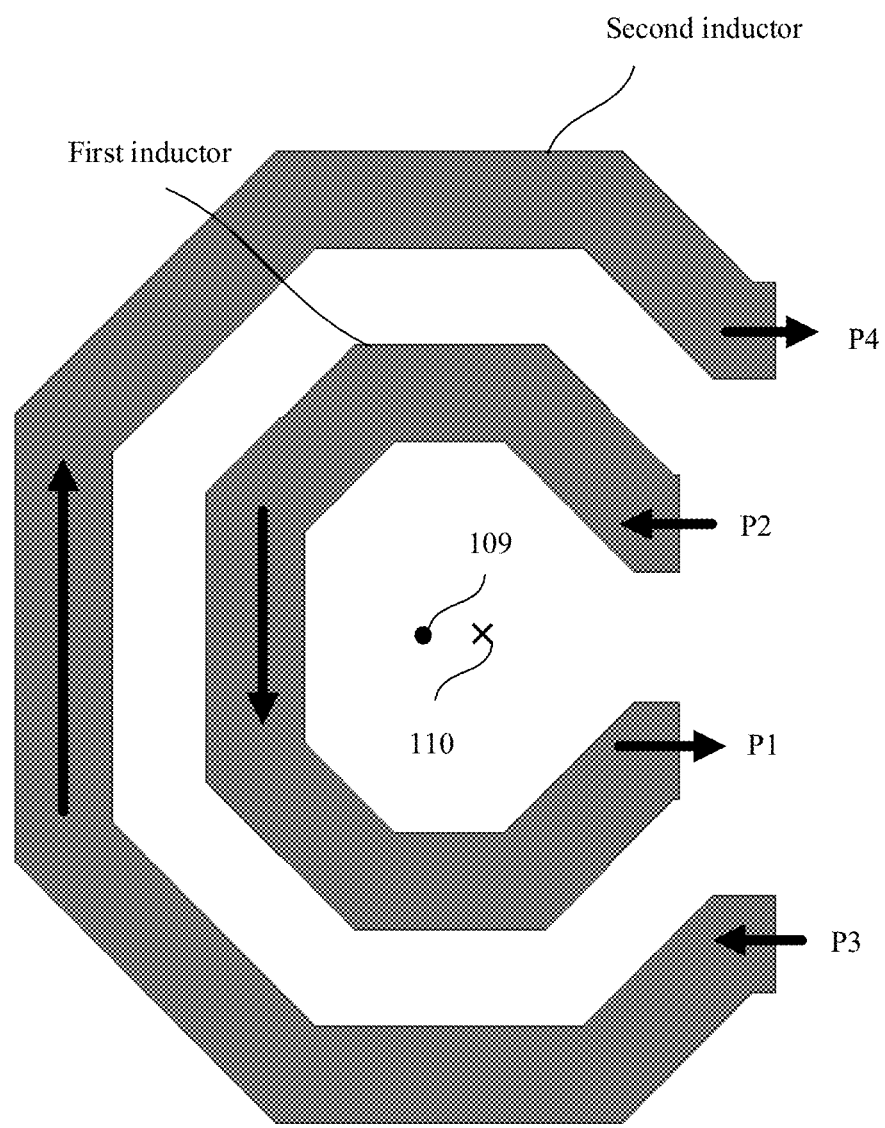
FIG. 1e is a schematic diagram of another example of a current flow direction and a direction of magnetic lines of force at a moment in a dual-inductor structure according to an embodiment of this application.
Figure 1F:
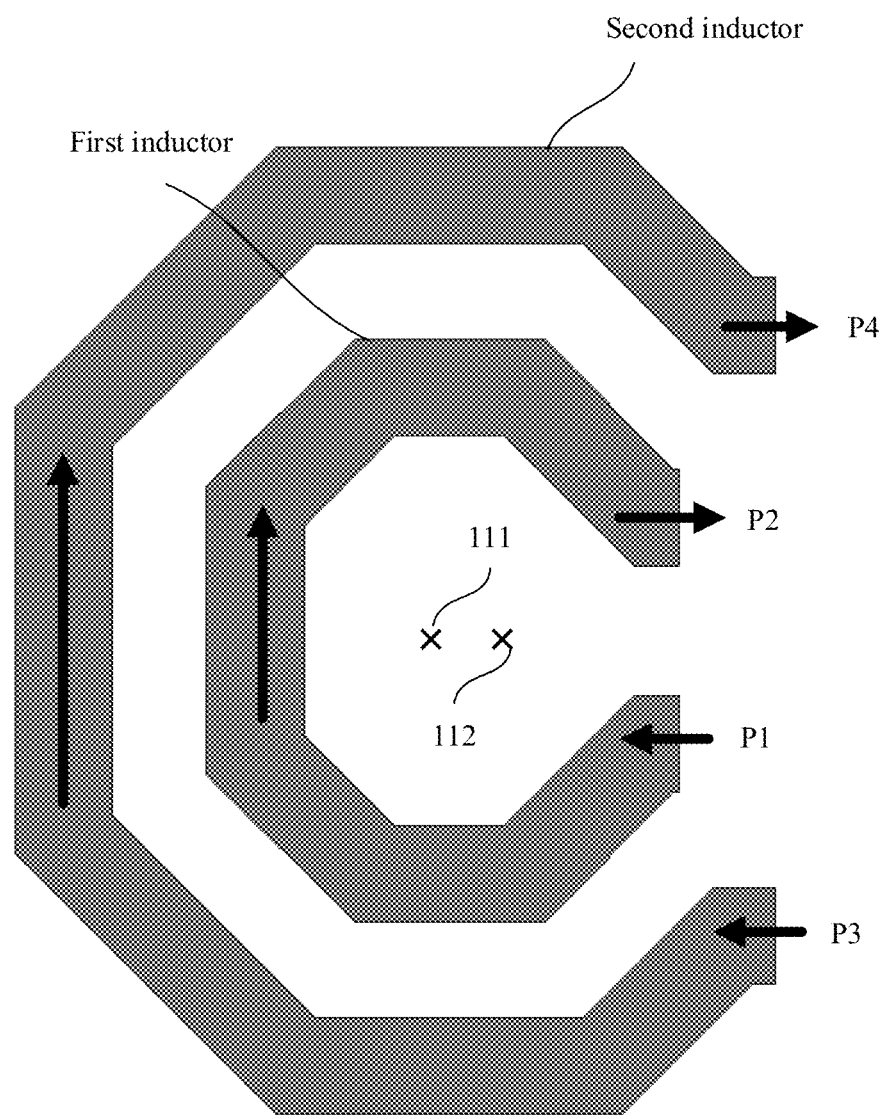
FIG. 1f is a schematic diagram of another example of a current flow direction and a direction of magnetic lines of force at a moment in a dual-inductor structure according to an embodiment of this application.

In an optional case, the first inductor and the second inductor are at different metal layers and completely overlap. In an optional case, one of the two inductors may be large and the other of the two inductors may be small. For example, the first inductor is a small coil, the second inductor is a large coil, and the first inductor is sleeved on an inner side of the second inductor, as shown in FIG. 1e and FIG. 1f. It should be understood that, when the large inductor sleeves the small inductor, the first inductor and the second inductor may be located at a same metal layer, or may be located at different metal layers.

As shown in FIG. 1a, FIG. 1c, and FIG. 1d, ports of the first inductor and ports of the second inductor face different directions, for example, opposite directions. For example, in FIG. 1a, the ports of the first inductor face a right side, and the ports of the second inductor face a left side. In this case, when both flow directions of currents in the first inductor and the second inductor are clockwise or counterclockwise, magnetic lines of force inside the first induction coil and magnetic lines of force inside the second induction coil are in opposite directions, and the two inductors generate negative mutual inductance. When a flow direction of a current in the first inductor is clockwise and a flow direction of a current in the second inductor is counterclockwise, or when a flow direction of a current in the first inductor is counterclockwise and a flow direction of a current in the second inductor is clockwise, magnetic lines of force inside the first induction coil and magnetic lines of force inside the second induction coil are in a same direction, and the two inductors generate positive mutual inductance.

In an optional case, ports of the first inductor and ports of the second inductor face a same direction, as shown in FIG. 1e and FIG. 1f. In this case, when both flow directions of currents in the first inductor and the second inductor are clockwise or counterclockwise, magnetic lines of force generated by the first inductor inside the second induction coil and magnetic lines of force generated by the second inductor are in a same direction, and the two inductors generate positive mutual inductance. At a same moment, a current in the first inductor flows from P1 to P2, and a current in the second inductor flows from P3 to P4; or at a same moment, a current in the first inductor flows from P2 to P1, and a current in the second inductor flows from P4 to P3. Correspondingly, when a flow direction of the current in the first inductor is clockwise and a flow direction of the current in the second inductor is counterclockwise, or when a flow direction of the current in the first inductor is counterclockwise and a flow direction of the current in the second inductor is clockwise, magnetic lines of force generated by the first inductor and magnetic lines of force generated by the second inductor are in opposite directions inside the first induction coil and the second induction coil, and the two inductors generate negative mutual inductance. In this case, at a same moment, a current in the first inductor flows from P1 to P2, and a current in the second inductor flows from P4 to P3; or at a same moment, a current in the first inductor flows from P2 to P1, and a current in the second inductor flows from P3 to P4.

FIG. 1e is a schematic diagram of a current flow direction and a direction of magnetic lines of force at a moment in another dual-inductor structure according to an embodiment of this application.

P2 of a first inductor is an input port of a current, P1 is an output port of the current, P3 of a second inductor is an input port of a current, and P4 is an output port of the current. A flow direction of the current in the first inductor is counterclockwise, and a flow direction of the current in the second inductor is clockwise. As shown in the figure, 109 indicates that magnetic lines of force generated by the first inductor inside a first induction coil are perpendicular outward to a plane on which the inductor is located, and 110 indicates that magnetic lines of force generated by the second inductor inside the first induction coil are perpendicular inward to the plane on which the inductor is located. In this case, the magnetic lines of force 109 and the magnetic lines of force 110 are in opposite directions.

FIG. 1f is a schematic diagram of a current flow direction and a direction of magnetic lines of force at a moment in another dual-inductor structure according to an embodiment of this application.

P1 of a first inductor is an input port of a current, P2 is an output port of the current, P3 of a second inductor is an input port of a current, and P4 is an output port of the current. A flow direction of the current in the first inductor is clockwise, and a flow direction of the current in the second inductor is clockwise. As shown in the figure, 111 indicates that magnetic lines of force generated by the first inductor inside a first induction coil are perpendicular inward to a plane on which the inductor is located, and 112 indicates that magnetic lines of force generated by the second inductor inside the first induction coil are perpendicular inward to the plane on which the inductor is located. In this case, the magnetic lines of force 111 and the magnetic lines of force 112 are in a same direction.

Theoretically, the first resonant circuit and the second resonant circuit may oscillate in an in-phase mode, or may oscillate in a reverse-phase mode, and oscillation startup modes of the first resonant circuit and the second resonant circuit are not fixed. Therefore, flow directions of the currents in the first inductor and the second inductor may be the same, for example, both are clockwise or both are counterclockwise. Alternatively, flow directions of the currents in the first inductor and the second inductor may be opposite. For example, a flow direction of a current in one inductor is clockwise, while a flow direction of a current in the other inductor is counterclockwise. Therefore, two oscillation modes may exist between the first resonant circuit and the second resonant circuit, and correspond to two oscillation frequencies. As a result, the resonant circuit may oscillate at another frequency other than a specified frequency; consequently, stability of a working frequency of the resonant circuit is affected. Theoretically, it is expected that there is only one oscillation mode between two inductors. For example, only an in-phase oscillation mode exists, or only a reverse-phase oscillation mode exists.

An embodiment of this application provides an integrated circuit. The integrated circuit includes a first resonant circuit and a second resonant circuit. The first resonant circuit includes a first inductor, and the second resonant circuit includes a second inductor. The integrated circuit further includes a connection circuit, and the connection circuit is connected between a port of the first inductor and a port of the second inductor. The connection circuit provides an electrical connection between the first inductor and the second inductor. In other words, the connection circuit is physically connected to both the first inductor and the second inductor, and is not coupling generated because the first inductor and the second inductor are close to each other. The connection circuit can reduce one of oscillation modes between the first resonant circuit and the second resonant circuit, so that there is only one oscillation mode between the first resonant circuit and the second resonant circuit, thereby improving stability of a working frequency of the resonant circuit. In an optional case, based on the connection circuit provided in this embodiment of this application, magnetic field intensity of magnetic lines of force generated by the first inductor and magnetic field intensity of magnetic lines of force generated by the second inductor may always be mutually strengthened or mutually weakened inside a first induction coil and a second induction coil. Therefore, only a reverse-phase oscillation mode or an in-phase oscillation mode exists between the first resonant circuit and the second resonant circuit. In other words, based on the connection circuit provided in this embodiment of this application, two ports connected to the connection circuit are always input ports of currents, or are always output ports of currents. For example, if a connection circuit is connected between a first port and a third port, the first port and the third port are always input ports of currents, or are always output ports of currents. If a connection circuit is connected between a first port and a fourth port, the first port and the fourth port are always input ports of currents, or are always output ports of currents.

For example, when a connection circuit is connected between P1 and P3 and a connection circuit is connected between P2 and P4, a reverse-phase mode between the first inductor and the second inductor does not exist, and only an in-phase mode exists. In this case, both P1 and P3 are input ports of currents or output ports of currents. This case is also applied to P2 and P4.

When a connection circuit is connected between P1 and P4 and a connection circuit is connected between P2 and P3, an in-phase mode between the first inductor and the second inductor does not exist, and only a reverse-phase mode exists. In this case, both P1 and P4 are input ports of currents or output ports of currents. This case is also applied to P2 and P3.

For example, the resonant circuit may be an oscillator. Further, the oscillator may include a voltage controlled oscillator (VCO), a digitally controlled oscillator (DCO), or the like, but is not limited thereto. The following describes, by using an example in which a resonant circuit is a VCO, a connection circuit between inductors provided in the embodiments of this application.

Figure 2:
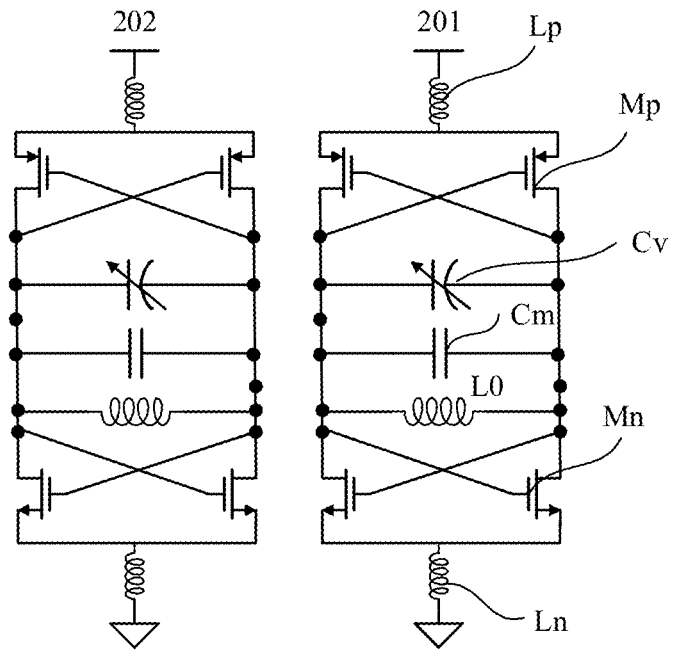
FIG. 2 is a schematic diagram of an example of a dual-core VCO structure according to an embodiment of this application.

The VCO is a key circuit module in a phase locked loop (PLL) circuit, and a dual-core VCO structure can effectively improve noise performance of the PLL circuit. The dual-core VCO is an example structure of the VCO, the dual-core VCO includes two VCO cores, and the two VCO cores form one VCO. FIG. 2 is a schematic diagram of an example of a dual-core VCO structure according to an embodiment of this application. The dual-core VCO structure includes a first VCO core 201 and a second VCO core 202. The following uses the first VCO core 201 as an example for description. The first VCO core 201 includes Lp, Ln, Mp, Mn, Cv, Cm, and L0. Lp and Ln are tail inductors. Mp and Mn are differential pair transistors, the differential pair transistor may also be referred to as a Gm transistor, and the differential pair transistor has a negative resistor −gm. Cv is a varactor. Cm is a switched capacitor array. L0 is a primary inductor of the VCO. The second VCO core 202 has a structure similar to that of the first VCO core 201. Details are not described herein again. It should be understood that components of the first VCO core and the second VCO core may have a same specification, or may have different specifications. The two inductors in the dual-inductor structure shown in FIG. 1a may be two inductors in the dual-VCO structure shown in FIG. 2. For example, the first inductor in FIG. 1a is a primary inductor of the first VCO core in FIG. 2, and the second inductor is a primary inductor of the second VCO core in FIG. 2. When the first inductor and the second inductor work in an in-phase mode, and correspondingly, the first VCO core and the second VCO core also work in an in-phase mode, an oscillation frequency between the two VCO cores is an in-phase oscillation frequency. When the first inductor and the second inductor work in a reverse-phase mode, and correspondingly, the first VCO core and the second VCO core also work in a reverse-phase mode, an oscillation frequency between the two VCO cores is a reverse-phase mode oscillation frequency. It should be understood that the dual-core VCO structure shown in FIG. 2 is merely an example structure of the dual-core VCO, and does not constitute a limitation on the dual-core VCO structure. In addition, the first VCO core and the second VCO core shown in FIG. 2 are also an example structure of the VCO core. Actually, there may alternatively be another variant structure. This is not limited in this embodiment of this application. For example, the first VCO core and the second VCO core each may be a VCO of an N-type MOS field effect transistor structure, a VCO of a P-type MOS structure, a VCO of a complementary metal oxide semiconductor (CMOS) structure, or the like.

Figure 3:
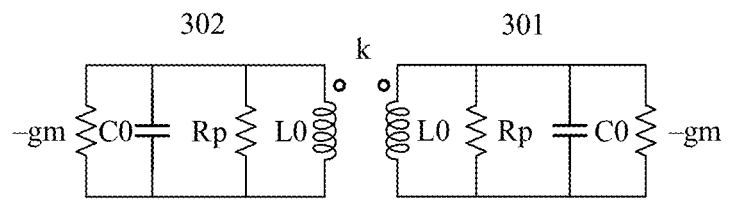
FIG. 3 is a schematic circuit diagram of an example of a simplified resistor, inductor, and capacitor RLC model of a dual-core VCO structure according to an embodiment of this application.

FIG. 3 is a schematic circuit diagram of an example of a simplified resistor, inductor, and capacitor RLC model of a dual-core VCO structure according to an embodiment of this application.

The dual-core VCO includes a first VCO core 301 and a second VCO core 302. The first VCO core 301 and the second VCO core 302 each include a negative resistor $-gm$, a capacitor C0, a resistor Rp, and an inductor L0. All the negative resistor $-gm$, the capacitor C0, and the resistor R0 are connected in parallel to two ports of the inductor L0. $-gm$ represents a negative resistor provided by a differential pair transistor, C0 represents an equivalent capacitor of the VCO core, Rp represents an equivalent parallel resistor of the VCO core, L0 represents an equivalent inductor of the VCO core, and k represents a mutual inductance coefficient between equivalent inductors L0 of the two VCOs. It should be understood that the first VCO core 301 and the second VCO core 302 shown in FIG. 3 are completely symmetric. In an optional case, the first VCO core 301 and the second VCO core 302 may alternatively have different negative resistance values, capacitance values, resistance values, and inductance values. When the first VCO core 301 and the second VCO core work in a reverse-phase mode, negative mutual inductance is generated between the two inductors, that is, $k<0$. When the first VCO core and the second VCO core work in an in-phase mode, positive mutual inductance is generated between the two inductors, that is, $k>0$. In this case, two oscillation modes exist between two VCO cores, and correspond to two oscillation frequencies. This affects stability of an oscillation frequency of the VCO. Therefore, it is theoretically expected that there is only one oscillation mode between two VCOs.

A connection circuit provided in this embodiment of this application is connected between the two inductors, so that a reverse-phase oscillation mode or an in-phase oscillation mode between the two inductors cannot work, and the dual-core VCO has only one oscillation mode, thereby significantly improving stability of the oscillation frequency of the VCO.

Figure 4A:
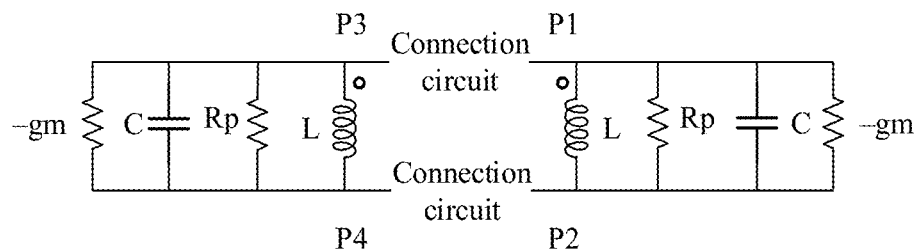
FIG. 4a is a circuit structural diagram of an example of a connection circuit connected between inductors according to an embodiment of this application.
Figure 4B:
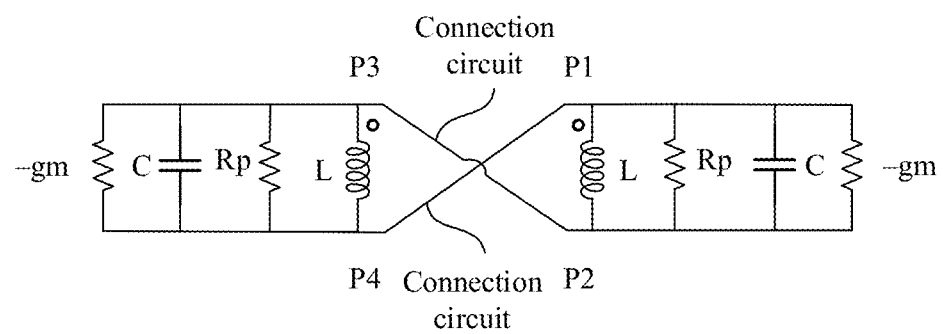
FIG. 4b is a circuit structural diagram of an example of a connection circuit connected between inductors according to an embodiment of this application.

FIG. 4a and FIG. 4b are circuit structural diagrams of two examples of a connection circuit connected between inductors according to an embodiment of this application. In FIG. 4a, the connection circuit is connected between P1 and P3 and the connection circuit is connected between P2 and P4. A connection mode in FIG. 4a can suppress a reverse-phase oscillation mode between two VCO cores. In FIG. 4b, the connection circuit is connected between P1 and P4 and the connection circuit is connected between P2 and P3. A connection mode in FIG. 4b can suppress an in-phase oscillation mode between two VCO cores. In FIG. 4a, the connection circuit is connected between P2 and P4 and the connection circuit is connected between P1 and P3. The connection circuit connected between P2 and P4 and the connection circuit connected between P1 and P3 may be same or different. For example, the connection circuit may be connected only between P2 and P4, or the connection circuit may be connected only between P1 and P3. Correspondingly, in FIG. 4b, the connection circuit connected between P1 and P4 and the connection circuit connected between P2 and P3 may be same or different. Alternatively, the connection circuit may exist only between P1 and P4, or the connection circuit may exist only between P2 and P3. A connection form of the connection circuit is not limited in this embodiment of this application.

The connection circuit may be a metal connection wire, and the metal connection wire includes one or more layers of metal layer connection wires.

The connection circuit may be made of a superconducting material, and a resistance value of the superconducting material is 0. In other words, when the connection circuit is made of a superconducting material, two ports connected by using the connection circuit are short-circuited. For example, when a superconducting material or another material without resistance or a material with scarce resistance is connected between P1 and P3, it is considered that P1 and P3 are short-circuited. In an optional case, the connection circuit may include at least one of an inductor, a resistor, or a capacitor. In other words, the connection circuit may include only a resistor R, only an inductor L, or only a capacitor C; or may include a resistor-inductor RL series network, a resistor-inductor R1, parallel network, a resistor-capacitor RC series network, a resistor-capacitor RC parallel network, an inductor-capacitor LC series network, or an inductor-capacitor LC parallel network; or may include a resistor-inductor-capacitor RLC series network or an RLC parallel network. In addition, a quantity of Rs, Ls, and Cs in the connection circuit is not limited in this embodiment of this application. In an optional case, the resistor, the inductor, and the capacitor may be implemented by an on-chip resistor, an on-chip inductor, and an on-chip capacitor. In addition, a metal connection wire of each metal layer of a chip may also be used for implementation. The metal connection wire may also be referred to as a metal cable or a metal wire. For example, when the metal cable or the metal wire is thin and long, the metal cable or the metal wire has resistance and inductance, and therefore can be used as a resistor or an inductor. For example, the on-chip resistor may include a metal, a polycrystalline silicon resistor, a conducted MOS transistor, and the like. The on-chip capacitor may include a MOM capacitor, a MIM capacitor, or a MOS capacitor. The on-chip inductor may include a metal, for example, may be a metal wire. Based on different shapes, the on-chip inductor can be classified into an octagonal inductor, a ring inductor, an octagonal inductor, and the like. Based on symmetry, the on-chip inductor can be classified into a differential inductor and a single-ended inductor. Based on whether there is a tap, the on-chip inductor can be classified into a tap inductor and a non-tap inductor.

Figure 5:
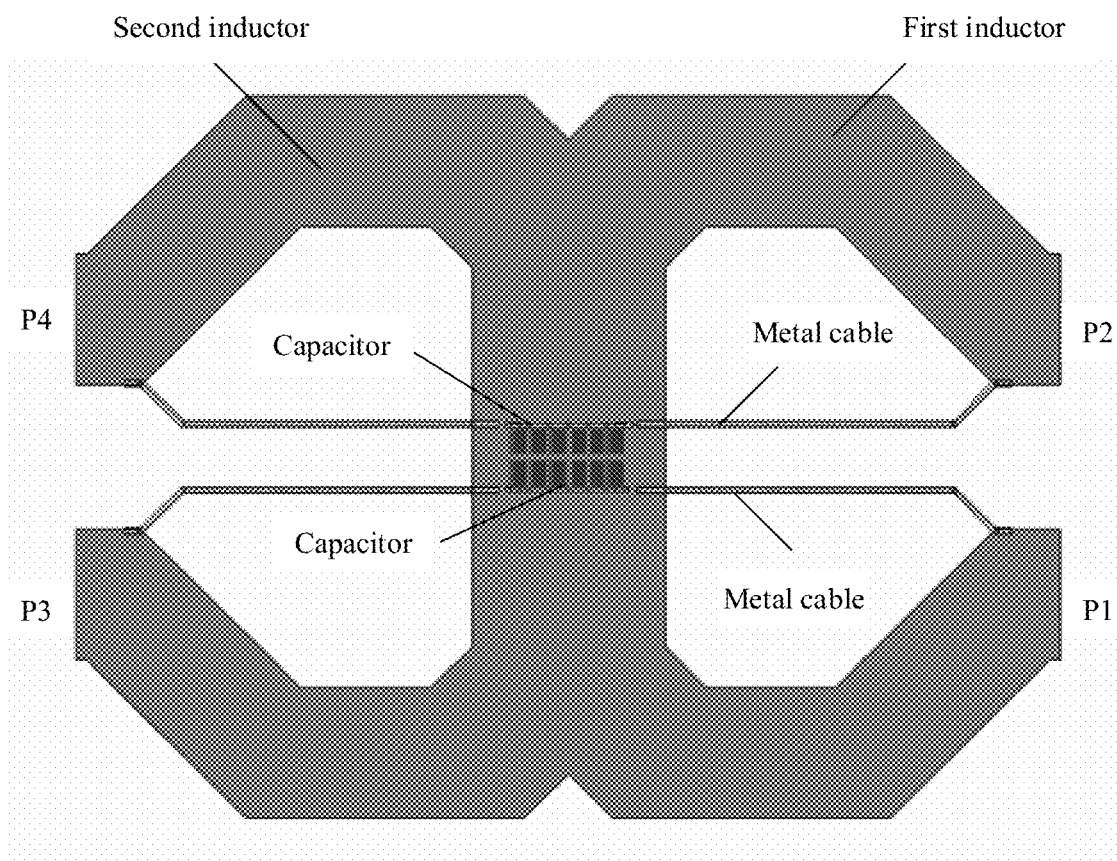
FIG. 5 is a schematic layout diagram of an example of a connection circuit connected between two inductors according to an embodiment of this application.

For example, a metal cable may be directly connected between P2 and P4 and/or a metal cable may be connected between P1 and P3; and a capacitor may be connected in series between P2 and P4 and/or a capacitor may be connected in series between P1 and P3. In this case, the metal cable is used as a resistor and an inductor, and a connection circuit may be equivalent to a series network of a resistor R, an inductor L, and a capacitor C, that is, an RLC series network. For example, a metal cable may alternatively be directly connected between P2 and P4 and/or a metal cable may alternatively be directly between P1 and P3. In this case, a connection circuit may be equivalent to a series network of a resistor and an inductor, that is, an RL series network. In an optional case, resistance and inductance of the metal cable may be ignored. For example, resistance or inductance of a wide and short metal cable may be ignored. For example, the inductor and the resistor may be implemented by using a metal wire in addition to an inductor component and a resistor component. Because the metal wire has resistance and inductance, a section of metal wire may be equivalent to the resistor and the inductor. The capacitor may be implemented by using a capacitor, a diode, a MOS transistor, or a varactor. FIG. 5 is a schematic layout diagram of an example of a connection circuit connected between two inductors according to an embodiment of this application. In FIG. 5, a metal cable is connected between P1 and P3, and a metal cable is connected between P2 and P4; and a capacitor is connected in series between P1 and P3, and a capacitor is connected in series between P2 and P4. In this case, a connection circuit includes a metal cable and a capacitor. In this case, the connection circuit is equivalent to an RLC series circuit. Correspondingly, in FIG. 5, it may be considered that a capacitor is connected between P2 and P4 through a metal cable, and a capacitor is connected between P1 and P3 through a metal cable. The connection circuit reduces an equivalent parallel resistance value of a primary inductor of a VCO core, and can suppress a reverse-phase oscillation mode between two VCO cores. In an optional implementation, the connection circuit makes the reverse-phase oscillation mode between the two VCO cores unable to work, and therefore only an in-phase oscillation mode exists between the two VCO cores. Correspondingly, only positive mutual inductance exists between the two inductors. In this case, a layout area of a dual-inductor structure may be designed to be smaller and more compact, and a Q value of the inductor is also larger, where the Q value of the inductor=(energy stored by the inductor per unit time)/(energy consumed by the inductor per unit time). Further, when positive mutual inductance is generated between the two inductors, currents of two induction coils are in opposite directions, and therefore magnetic field intensity in directions of magnetic lines of force is strengthened inside the two coils, and are offset outside the coils. This helps eliminate electromagnetic interference (EMI).

In FIG. 5, a first inductor and a second inductor partially overlap, and there is a co-grounded connection between the first inductor and the second inductor through an overlapping part. However, it should be understood that, in an optional case, the first inductor and the second inductor may not overlap, but be adjacent to each other. The first inductor and the second inductor may be located at a same metal layer, or the first inductor and the second inductor may be located at different metal layers. Locations or a connection relationship between the first inductor and the second inductor are/is not limited in this embodiment of this application. It should be understood that the first inductor and the second inductor are coupled to each other, and the coupling affects a circuit in which the first inductor and the second inductor are located. The first inductor includes ports P2 and P1, and the second inductor includes ports P4 and P3. In this embodiment of this application, a metal cable is directly connected between P2 and P4, and a capacitor is connected in series between P2 and P4. A metal cable is directly connected between P1 and P3, and a capacitor is connected in series between P1 and P3. Optionally, at least one of a resistor, an inductor, or a capacitor may further be connected between P2 and P4 through the metal cable, and at least one of a resistor, an inductor, or a capacitor may further be connected between P1 and P3 through the metal cable.

Figure 6:
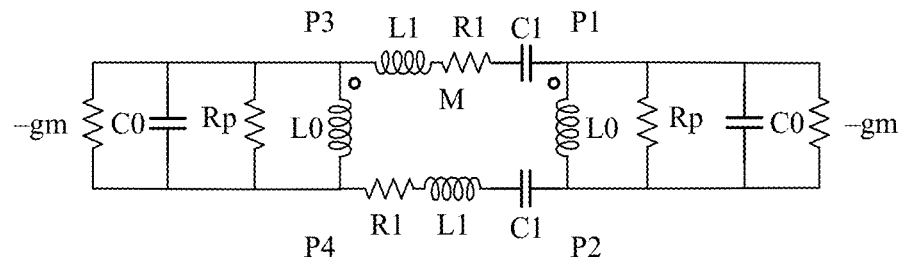
FIG. 6 is a schematic diagram of an example of a circuit structure including a dual-core VCO and a connection circuit according to an embodiment of this application.

Alternatively, only the metal cable may be connected between P2 and P4, and only the metal cable may be connected between P1 and P3. It should be understood that an electrical connection generated between P2 and P4 through the connection circuit and an electrical connection generated between P1 and P3 through the connection circuit each are different from the co-grounded connection at the overlapping part, and the connection between P2 and P4 and the connection between P1 and P3 each do not include the co-grounded connection. FIG. 6 is a schematic diagram of an example of a circuit structure including a dual-core VCO and a connection circuit according to an embodiment of this application. It should be understood that, two inductors L0 in the dual-core VCO in FIG. 6 are an example of the dual-inductor structure in FIG. 5, and a connection circuit connected between the two inductors L0 in FIG. 6 is an example of the connection circuit in FIG. 5.

The two inductors L0 shown in FIG. 6 are primary inductors in the two VCOs. An inductor L0 on a left side is a first inductor, and the first inductor is a primary inductor in a first VCO core. An inductor L0 on a right side is a second inductor, and the second inductor is a primary inductor in a second VCO core. M represents mutual inductance between the two inductors L0. In this embodiment of this application, an RLC series network is connected between P1 and P3, and an RLC series network is connected between P2 and P4. It should be understood that, in FIG. 6, both a capacitor connected in series between P1 and P3 and a capacitor connected in series between P2 and P4 are denoted as R1, both an inductor connected in series between P1 and P3 and an inductor connected in series between P2 and P4 are denoted as L1, and both a capacitor connected in series between P1 and P3 and a capacitor connected in series between P2 and P4 are denoted as C1. However, in an actual case, the resistor, the inductor, and the capacitor that are connected in series between P1 and P3 are respectively different from the resistor, the inductor, and the capacitor that are connected in series between P2 and P4.

The following analyzes a principle of suppressing a reverse-phase oscillation mode between the two VCO cores by using the connection circuit. It is assumed that the two VCO cores can normally work in a reverse-phase mode. In the reverse-phase mode, for a single VCO core, the connection circuit reduces an equivalent parallel resistance value of a primary inductor of the VCO core, and the equivalent parallel resistance value of the primary inductor determines whether the VCO core can oscillate at a reverse-phase oscillation frequency. When the equivalent parallel resistance value of the primary inductor decreases, a reverse-phase oscillation mode of the VCO core is weakened. When the equivalent parallel resistance value is less than a preset threshold, the reverse-phase oscillation mode of the VCO core cannot work, so as to reduce or suppress the reverse-phase oscillation mode between the two VCO cores. It should be understood that, because of existence of the connection circuit, the reverse-phase oscillation mode between the two VCO cores is weakened. Optionally, the reverse-phase oscillation mode between the two VCO cores cannot work because of existence of the connection circuit, and no reverse-phase oscillation mode exists between the two VCO cores.

Figure 7A:
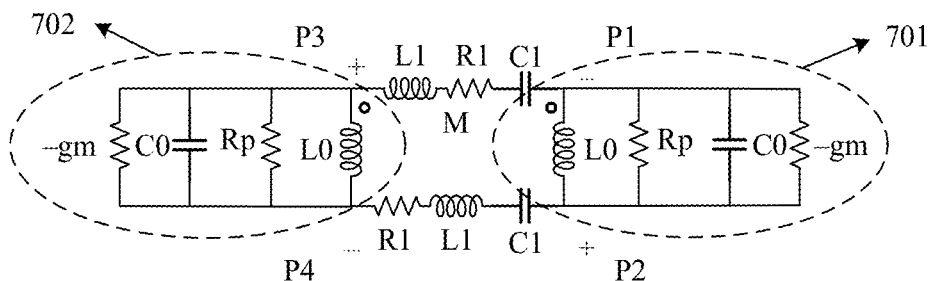
FIG. 7a is a schematic circuit diagram of an example of an equivalent inductance mode when two VCO cores work in a reverse-phase mode according to an embodiment of this application.
Figure 7B:
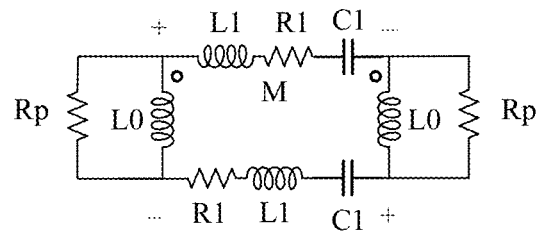
FIG. 7b shows an example of a phase 1 in an equivalent transformation process of a circuit on a single VCO core side in a reverse-phase mode according to an embodiment of this application.
Figure 7C:
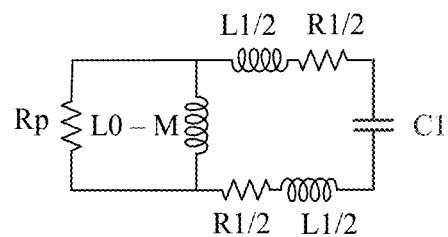
FIG. 7c shows an example of a phase 2 in an equivalent transformation process of a circuit on a single VCO core side in a reverse-phase mode according to an embodiment of this application.
Figure 7D:
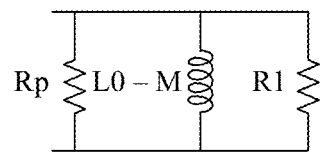
FIG. 7d is a schematic diagram of an example of an equivalent transformation result of a circuit on a single VCO core side in a reverse-phase mode according to an embodiment of this application.
Figure 7E:
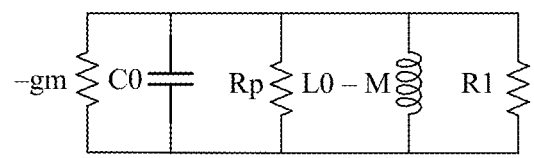
FIG. 7e is a schematic diagram of an example of an equivalent transformation result according to an embodiment of this application.

First, this embodiment of this application is described by using FIG. 7*a* to FIG. 7*c*. When working in a reverse-phase mode, a connection circuit connected between P1 and P3 and a connection circuit between P2 and P4 may be equivalent to an RLC series network connected in parallel to two ports of a primary inductor of a single VCO core. Further, as illustrated in FIG. 7d and FIG. 7e, when an inductor and a capacitor in the connection circuit are set to proper values, impedances of an inductor and a capacitor change to 0 in a reverse-phase oscillation mode. This is equivalent to connecting a resistor in parallel to the two ports of the primary inductor of the single VCO core. Further, in this embodiment of this application, an oscillation startup condition is described to indicate that the resistor reduces an equivalent parallel resistance value of the primary inductor of the VCO core, and affects an oscillation startup condition of the VCO core in the reverse-phase oscillation mode, thereby reducing or suppressing the reverse-phase oscillation mode of the VCO core.

FIG. 7a is a schematic circuit diagram of an equivalent inductance mode when the two VCO cores in FIG. 6 work in a reverse-phase mode according to this embodiment of this application. It should be understood that, in FIG. 7a, it is assumed that the two VCO cores may work in a reverse-phase mode. Actually, because of existence of a connection circuit, the reverse-phase mode of the two VCO cores does not meet an oscillation startup condition. As a result, the reverse-phase mode does not occur when the circuit works. An inductor L0 of a first VCO core 701 includes two ports P1 and P2, and an inductor L0 of a second VCO core 702 includes two ports P3 and P4. When the first VCO core 701 and the second VCO core 702 work in a reverse-phase mode, a phase difference between P2 and P4 is 180°, and a phase difference between P1 and P3 is 180°. It should be understood that, when the first VCO core 701 and the second VCO core 702 work in a reverse-phase mode, the phase difference between P2 and P4 is not necessarily 180°, and the phase difference between P1 and P3 is not necessarily 180°. For details, refer to the foregoing definitions of in-phase and reverse-phase.

FIG. 7b to FIG. 7d each show an equivalent transformation process on a side of the second VCO core 702 in the reverse-phase mode. It should be understood that, although the equivalent transformation process in each of FIG. 7b to FIG. 7d is described by using only 702 as an example, the equivalent transformation process is also applicable to the first VCO core 701. In addition, it should be noted that, because in the transformation process, a negative resistor −gm and a capacitor C0 do not change, in the transformation process in each of FIG. 7b to FIG. 7d, only a resistor Rp and an inductor L0 are shown, and the negative resistor −gm and the capacitor C0 are omitted.

In the reverse-phase mode, when an RLC series network is connected between P2 and P4, and an RLC series network is connected between P1 and P3, for a single VCO, a circuit diagram in FIG. 7b may be equivalently converted into a circuit diagram in FIG. 7c. In this case, it is equivalent to connecting an RLC series network in parallel to two ports of an inductor L0-M, where the RLC series network includes a resistor, an inductor, and a capacitor. Because negative mutual inductance M exists between the two inductors L0, a primary inductance value of the single VCO is equivalent to L0-M. In the RLC series network, a resistance value is R1, an inductance value is L1, and a capacitance value is C1. It should be understood that because the first VCO core and the second VCO core shown in FIG. 7b are symmetric, that is, both an inductance value of the first VCO core and an inductance value of the second VCO core are L0, both a capacitance value of the first VCO core and a capacitance value of the second VCO core are C0, both a resistance value of the first VCO core and a resistance value of the second VCO core are Rp, and both a negative resistance value of the first VCO core and a negative resistance value of the second VCO core are −gm. In addition, a connection circuit connected between P1 and P3 and a connection circuit connected between P2 and P4 are symmetrical. Therefore, when a circuit in FIG. 7b is equivalently transformed to a circuit in FIG. 7c, a resistance value, an inductance value, and a capacitance value of the parallel RLC network are respectively the resistance value R1, the inductance value L1, and the capacitance value C1 of the connection circuit.

Figure 7F:
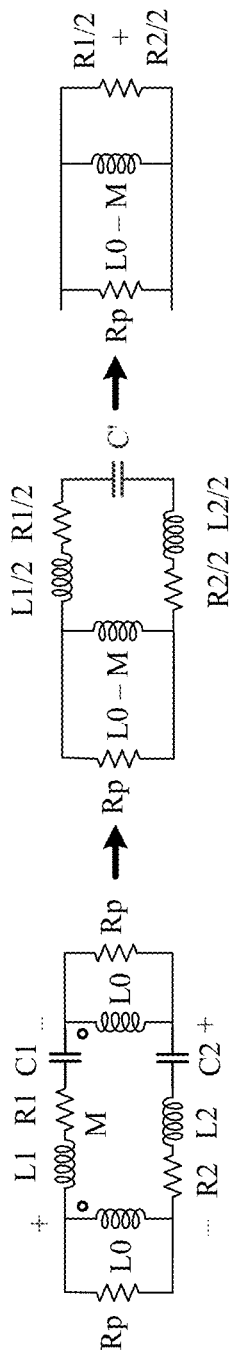
FIG. 7f shows an example of an equivalent transformation process of a circuit on a single VCO core side when a first connection circuit and a second connection circuit are asymmetrical according to an embodiment of this application.

Optionally, when the first VCO core and the second VCO core are asymmetrical, or when a connection circuit connected between P1 and P3 and a connection circuit connected between P2 and P4 are asymmetrical, the resistance value, the inductance value, and the capacitance value in the equivalent parallel RLC network may be unequal to the resistance value, the inductance value, and the capacitance value of the connection circuit. For example, a first connection circuit connected between P1 and P3 includes a resistor R1, an inductor L1, and a capacitor C1, and a second connection circuit connected between P2 and P4 includes a resistor R2, an inductor L2, and a capacitor C2. FIG. 7f shows an equivalent transformation process on a side of the second VCO core 702 when the first connection circuit and the second connection circuit are asymmetrical. For a single VCO core, it is equivalent to that in an RLC network connected in parallel to the two ports of the inductor L0-M, a resistance value is (R1+R2)/2, an inductance value is (L1+L2)/2, and a capacitance value is C'=(2× C1× C2)/(C1+C2).

In FIG. 7c, an RLC network connected in parallel to the two ports of the inductor L0-M includes an LC resonant network. In the LC resonant network, an inductance value is L1, and a capacitance value is C1. Persons skilled in the art may know that impedances of L1 and C1 at a resonant point are 0. At the resonance point of the LC resonant network, an impedance of the LC in the RLC network changes to 0, and only one resistor R1 is left, as shown in a circuit in FIG. 7d.

The following describes a principle in which the impedance of the LC resonant network at the resonant point is 0. Because the principle is universal, the following uses a universal LC resonant network as an example for description, and any LC resonant network is applicable to the principle.

At a resonant frequency of the LC resonant network, $$\omega = \frac{1}{\sqrt{LC}},$$

where w is a resonant angular frequency of the LC resonant network, L is an inductance value of an inductor in the LC resonant network, and C is a capacitance value of a capacitor in the LC resonant network. For example, for the equivalent transformation process shown in each of FIG. 7b to FIG. 7d, an inductance value in the LC resonance network is L1, that is, L=L1, and a capacitance value is C1, that is, C=C1. For the equivalent transformation process shown in FIG. 7f, an inductance value in the LC resonant network is (L1+L2)/2, that is, L=(L1+L2)/2, and a capacitance value is (2× C1× C2)/(C1+C2), that is, C=C'=(2× C1× C2)/(C1+C2). A formula for calculating an impedance of the LC resonant network is shown in formula (1):

$$Ls + \frac{1}{Cs} = \frac{LCs^2 + 1}{Cs} = \frac{1 - LC\omega^2}{C\omega j} \qquad \text{Formula (1)}$$

Ls is an inductive reactance of the inductor in the LC resonant network, Cs is a capacitive reactance of the capacitor in the LC resonant network, s is a Laplace operator, s=wj, j²=−1, and $$\omega = \frac{1}{\sqrt{LC}}$$

is substituted into the formula (1) to obtain $$Ls + \frac{1}{Cs} = 0.$$

In other words, at the resonant frequency of the LC resonant network, the impedance of the LC resonant network is 0.

Based on the foregoing principle, it may be learned that, if the resonance point (or the resonance frequency) of the LC resonance network is just equal to a reverse-phase oscillation frequency at which the two VCO cores work in the reverse-phase mode. For the VCO core that works in the reverse-phase mode, the impedances of L1 and C1 in the RLC network connected in parallel to the two ports of the inductor L0-M change to 0. In this case, it is equivalent to that only one resistor R1 is connected in parallel to the two ports of the inductor L0-M, as shown in FIG. 7d. Correspondingly, in the case shown in FIG. 7f, it is equivalent to that only one resistor (R1+R2)/2 is connected in parallel to the two ports of the inductor L0-M. It should be understood that the first VCO core and the second VCO core work as one VCO. Oscillation frequencies of the first VCO core and the second VCO core are equal, and are both equal to an oscillation frequency of a dual-core VCO. The dual-core VCO includes the first VCO core and the second VCO core.

Therefore, in an optional case, when L1 and C1 are set to proper values, and the resonance frequency of the LC resonance network is equal to the reverse-phase oscillation frequency at which the two VCO cores work in the reverse-phase mode, the impedances of L1 and C1 change to 0 at an oscillation frequency in the reverse-phase oscillation mode. Optionally, the resonance frequency of the LC resonant network does not necessarily need to be strictly equal to the reverse-phase oscillation frequency at which the dual VCO cores work in the reverse-phase mode. When a difference between the resonance frequency of the LC resonance network and the reverse-phase oscillation frequencies of the two VCO cores is less than a preset threshold, the reverse-phase oscillation mode may also fail to work.

The following describes an oscillation startup condition in the reverse-phase oscillation mode, as shown in formula (2):

$$gm * Rp' > 1 \quad (2)$$

Rp' is an equivalent parallel resistance value of the inductor L0-M, and gm is a resistance value of a negative resistor provided by a differential pair transistor in the VCO. When the equivalent parallel resistance value Rp' of the inductor L0-M makes gm×Rp' to be less than or equal to 1 and an oscillation startup gain of the VCO reverse-phase oscillation mode does not meet an oscillation startup condition, the reverse-phase oscillation mode cannot work.

FIG. 7e shows a circuit diagram includes a negative resistor −gm and a capacitor C on a basis of a circuit diagram in FIG. 7d. In this case, two resistors Rp and R1 are connected in parallel to the two ports of the inductor L0-M of the VCO core. In this case, the equivalent parallel resistor of the inductor L0-M is a parallel resistor of Rp and R1, that is, $$\frac{Rp * R1}{Rp + R1}.$$

Because $$\frac{Rp * R1}{Rp + R1} < \min(Rp, R1),$$

and R1 is usually relatively small, an equivalent parallel resistance value of the inductor is greatly reduced. When $$gm * \frac{Rp * R1}{Rp + R1} \leq 1,$$

the reverse-phase mode of the dual-core VCO will not meet the oscillation startup condition, and the reverse-phase oscillation mode cannot work. For example, a resistance value of the resistor R1 may range from 1 to 10 ohms. Correspondingly, in a case shown in FIG. 7f, two resistors Rp and (R1+R2)/2 are connected in parallel to the two ports of the inductor L0-M of the VCO core. In this case, the equivalent parallel resistor of the inductor L0-M is a parallel resistor of Rp and (R1+R2)/2. Assuming that R'=(R1+R2)/2, a parallel resistance value between Rp and R' may be represented as $$\frac{Rp * R'}{Rp + R'}.$$

When $$gm * \frac{Rp * R1}{Rp + R1} \leq 1,$$

the reverse-phase mode of the dual-core VCO will not meet the oscillation startup condition, and the reverse-phase oscillation mode cannot work. It should be understood that, when a resistance value of the connection circuit between P2 and P4 and a resistance value of the connection circuit between P1 and P3 each are less than a preset threshold, the reverse-phase oscillation mode of the VCO core does not meet the oscillation startup condition.

In conclusion, when a proper R, L, and C are connected between P2 and P4 of the two inductors L0 and a proper R, L, and C are connected between P1 and P3 of the two inductors L0, or a proper equivalent resistor, a proper equivalent inductor, and a proper equivalent capacitor are connected between P2 and P4 of the two inductors L0 and a proper equivalent resistor, a proper equivalent inductor, and a proper equivalent capacitor are connected between P1 and P3 of the two inductors L0, the reverse-phase oscillation mode of the VCO may not meet the oscillation startup condition. In this way, the reverse-phase mode of the dual-core VCO is suppressed.

Figure 8A:
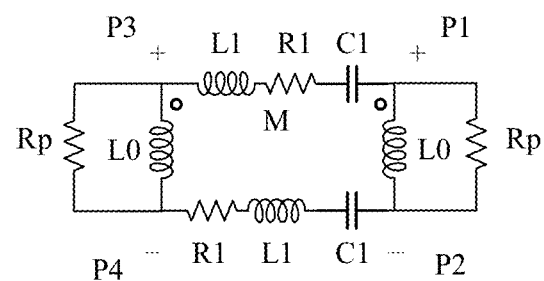
FIG. 8a is a schematic circuit diagram of an example of equivalent inductance when two VCO cores work in an in-phase mode according to an embodiment of this application.
Figure 8B:
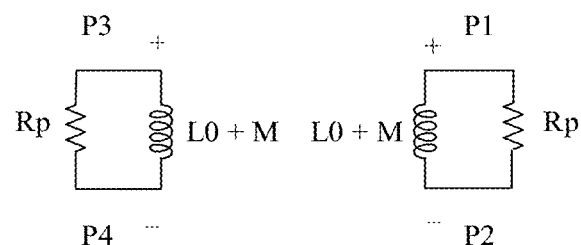
FIG. 8b is a schematic circuit diagram of an example of equivalent inductance when two VCO cores work in an in-phase mode according to an embodiment of this application.

For an in-phase mode, FIG. 8a and FIG. 8b are schematic circuit diagrams of equivalent inductance in which the two VCO cores in FIG. 6 work in an in-phase mode according to an embodiment of this application.

When the first VCO core and the second VCO core work in an in-phase mode, a phase difference between P2 and P4 is 0°, and a phase difference between P1 and P3 is 0°. It should be understood that, when the first VCO core and the second VCO core work in an in-phase mode, the phase difference between P2 and P4 is not necessarily 0°, and the phase difference between P1 and P3 is not necessarily 0°. For details, refer to the foregoing definitions of in-phase and reverse-phase. A circuit diagram shown in FIG. 8*a* may be equivalent to a circuit diagram shown in FIG. 8*b*. In this case, P2 and P4 are disconnected, and P1 and P3 are disconnected. Therefore, a connection circuit, of the two inductors L0, connected between P2 and P4 and a connection circuit, of the two inductors L0, connected between P1 and P3 each do not affect the two VCO cores in the in-phase mode. The two VCO cores are disconnected and do not interfere with each other.

In this way, the two VCO cores work only in the in-phase mode. Further, the two VCO cores have only one working frequency, thereby improving stability of a working frequency of the dual-core VCO, and avoiding impact on working performance of the VCO due to existence of a plurality of oscillation modes. In an optional case, the connection circuit connected in the dual-inductor structure suppresses the reverse-phase mode between the dual-core VCOs to some extent, but does not completely eliminate the reverse-phase mode.

An embodiment of this application provides a connection circuit between inductors. The connection circuit includes a resistor, an inductor, and a capacitor. For example, the inductor and the resistor may be implemented by using a metal wire in addition to an inductor component and a resistor component. Because the metal wire has resistance and inductance, a section of metal wire may be equivalent to the resistor and the inductor. The capacitor may be implemented by using a capacitor, a diode, a MOS transistor, or a varactor. When the connection circuit is connected between two inductors, an equivalent parallel resistance value of any inductor can be greatly reduced, so that a reverse-phase mode of a dual-core VCO does not meet an oscillation startup condition. In addition, the connection circuit does not affect an in-phase mode of the dual-core VCO. In this way, there is only one oscillation mode between the two VCO cores, and stability of an oscillation frequency of the dual-core VCO is improved.

Figure 9:
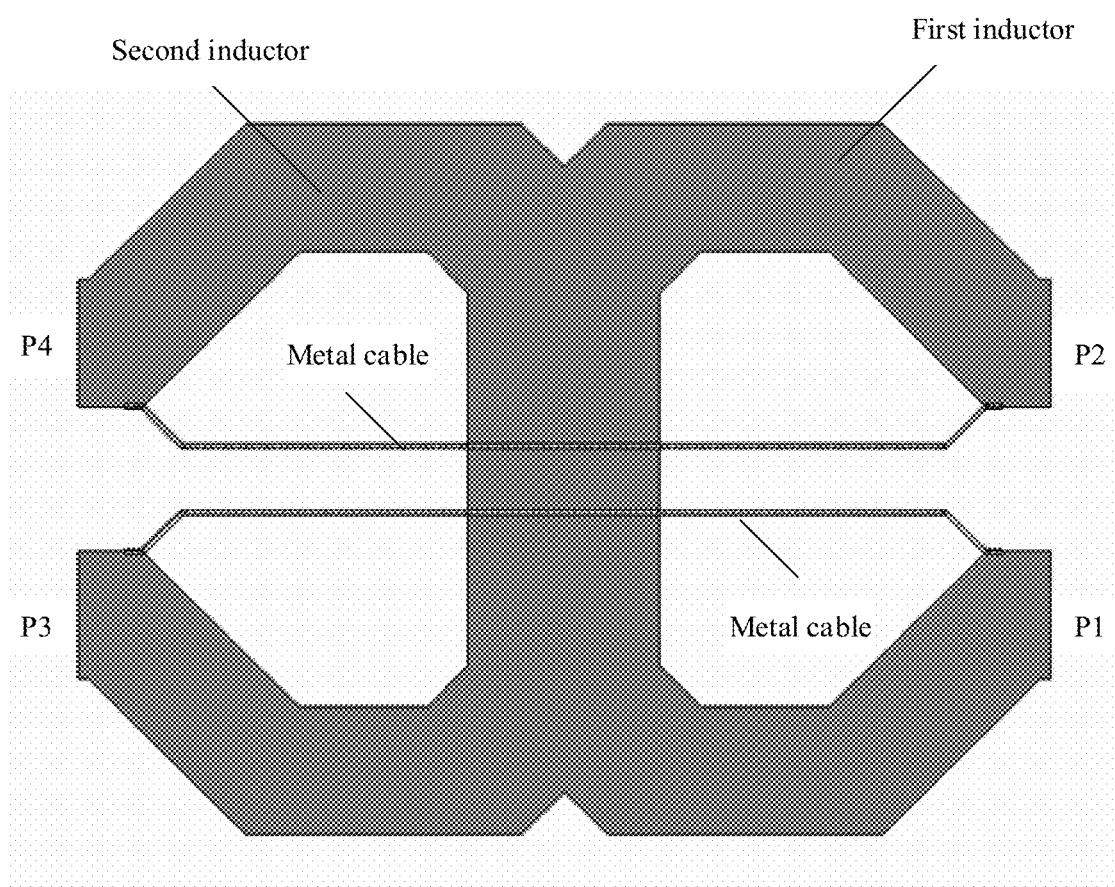
FIG. 9 is a schematic layout diagram of another example of a connection circuit connected between two inductors according to an embodiment of this application.

FIG. 9 is a schematic layout diagram of another example of connection circuits connected between two inductors according to an embodiment of this application.

Figure 10:
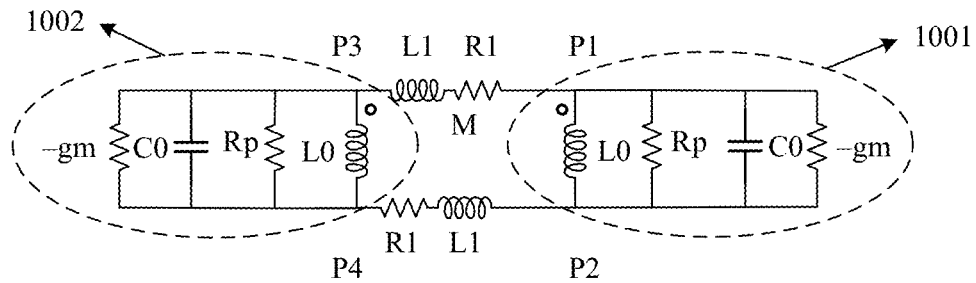
FIG. 10 is a schematic diagram of an example of a circuit structure including a dual-core VCO and a connection circuit according to an embodiment of this application.

Similar to FIG. 5, a first inductor and a second inductor in FIG. 9 partially overlap. In an optional case, the first inductor and the second inductor may not overlap with each other, but be adjacent to each other. The first inductor and the second inductor may be located at a same metal layer, or may be located at different metal layers. A physical connection may exist between the first inductor and the second inductor, or no physical connection exists between the first inductor and the second inductor. Locations or a connection relationship between the first inductor and the second inductor are/is not limited in this embodiment of this application. It should be understood that the first inductor and the second inductor are coupled to each other, and the coupling affects a circuit in which the first inductor and the second inductor are located. The first inductor includes ports P2 and P1, and the second inductor includes ports P4 and P3. In this embodiment of this application, P2 and P4 are directly connected, and P1 and P3 are directly connected. In an optional case, a metal cable is directly connected between P1 and P3 and a metal cable is directly connected between P2 and P4. Because the metal cable has resistance and inductance, a connection circuit in this case may be equivalent to an RL series network. It should be understood that optionally, the resistance or the inductance of the metal cable between P2 and P4 and the resistance or the inductance of the metal cable between P1 and P3 may be ignored. In this case, P2 and P4 are directly connected through the metal cable, and P1 and P3 are directly connected through the metal cable. In this case, P2 and P4 are approximately considered to be short-circuited, and P1 and P3 are approximately considered to be short-circuited. For example, resistance or inductance of a wide and short metal cable can be ignored. In another optional case, P2 and P4 are directly connected by using a superconductive cable, and P1 and P3 are directly connected by using a superconductive cable. In this case, it is equivalent to that P2 and P4 are short-circuited, and P1 and P3 are short-circuited. It should be understood that P2 and P4 may be short-circuited in another manner, and P1 and P3 may be short-circuited in another manner. This is not limited in this embodiment of this application. FIG. 10 is a schematic diagram of an example of a circuit structure including a dual-core VCO and a connection circuit according to an embodiment of this application. It should be understood that, two inductors L0 in the dual-core VCO in FIG. 10 are an example of the dual-inductor structure in FIG. 9, and a connection circuit connected between the two inductors L0 in FIG. 10 is an example structure of the connection circuit in FIG. 9.

FIG. 10 includes a first VCO core 1001 and a second VCO core 1002. An inductor L0 in the first VCO core 1001 is a first inductor, and an inductor L0 in the second VCO core 1002 is a second inductor. M is mutual inductance between the two inductors L0. In this embodiment of this application, an RL series network is connected between P1 and P3 and an RL series network is connected between P2 and P4. It should be understood that, although both a capacitor connected in series between P1 and P3 and a capacitor connected in series between P2 and P4 shown in FIG. 10 are denoted as R1, and both an inductor connected in series between P1 and P3 and an inductor connected in series between P2 and P4 are denoted L1, in an actual case, the RL that is connected in series between P1 and P3 is different from the RL that is connected in series between P2 and P4. The following analyzes a principle of suppressing a reverse-phase oscillation mode between two VCO cores by using the connection circuit. A connection mode of the connection circuit in this embodiment of this application can reduce or suppress the reverse-phase oscillation mode between the two VCO cores.

Figure 11A:
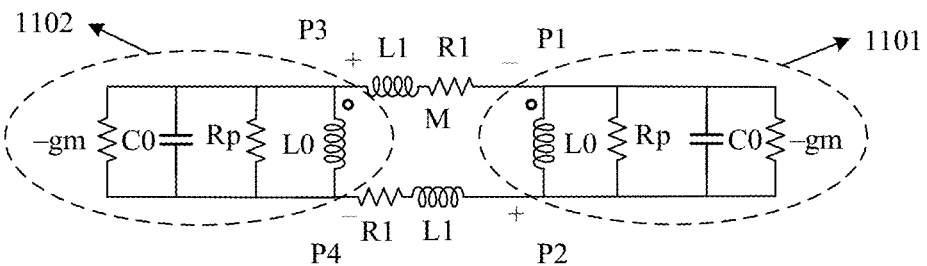
FIG. 11a is a schematic circuit diagram of an example of an equivalent inductance mode when two VCO cores work in a reverse-phase mode according to an embodiment of this application.

FIG. 11*a* is a schematic circuit diagram of an equivalent inductance mode when the two VCO cores in FIG. 10 work in a reverse phase mode according to an embodiment of this application. An inductor L0 of a first VCO core 1101 includes two ports P1 and P2, and an inductor L0 of a second VCO core 1102 includes two ports P3 and P4. When the first VCO core 1101 and the second VCO core 1102 work in a reverse-phase mode, a phase difference between P2 and P4 is 180°, and a phase difference between P1 and P3 is 180°. It should be understood that, when the first VCO core 1101 and the second VCO core 1102 work in a reverse-phase mode, the phase difference between P2 and P4 is not necessarily 180°, and the phase difference between P1 and P3 is not necessarily 180°. For details, refer to the foregoing definitions of in-phase and reverse-phase.

Figure 11B:
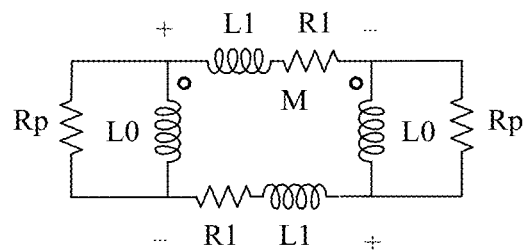
FIG. 11b shows an example of a phase 1 in an equivalent transformation process of a circuit on a single VCO core side in a reverse-phase mode according to an embodiment of this application.
Figure 11C:
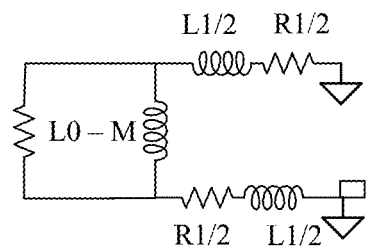
FIG. 11c shows an example of a phase 2 in an equivalent transformation process of a circuit on a single VCO core side in a reverse-phase mode according to an embodiment of this application.
Figure 11D:
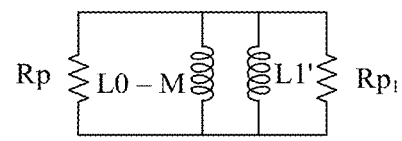
FIG. 11d is a schematic diagram of an example of an equivalent transformation result of a circuit on a single VCO core side in a reverse-phase mode according to an embodiment of this application.

As shown in each of FIG. 11b to FIG. 11d, an equivalent transformation process on a side of the second VCO core 1102 in the reverse-phase mode is provided. It should be understood that, although the equivalent transformation process in each of FIG. 11b to FIG. 11d is merely described by using 1102 as an example, the equivalent transformation process is applicable to both the first VCO core 1101 and the second VCO core 1102. It should be noted that, because in the transformation process, a negative resistor −gm and a capacitor C0 do not change, in the transformation processes in each of FIG. 11b to FIG. 11d, only a resistor Rp and an inductor L0 are shown, and the negative resistor −gm and the capacitor C0 are omitted.

In the reverse-phase mode, when an RL series network is connected between P2 and P4 and an RL series network is connected between P1 and P3, for a single VCO core, a circuit diagram in FIG. 11b may be equivalently converted into a circuit diagram in FIG. 11c. Because negative mutual inductance M exists between the two inductors, a primary inductor of the single VCO core is equivalent to changing to L0-M. Further, a circuit diagram in FIG. 11c may be equivalent to a circuit diagram in FIG. 11d. In other words, an inductor L1 and a resistor R1 are connected between P2 and P4 of the two inductors L0 and an inductor L1 and a resistor R1 are connected between P1 and P3 of the two inductors L0. This may be equivalent to that an inductor L1' and a resistor Rp1 are connected in parallel to two ports of any inductor L0. L1' is an equivalent parallel inductor of L1 relative to the inductor L0, and Rp1 is an equivalent parallel resistor of R1 and L1 relative to the inductor L0. It should be understood that, because a metal cable has inductance and resistance, in this embodiment of this application, connecting a metal cable between P2 and P4 and a metal cable between P1 and P3 is equivalent to connecting an equivalent inductor and an equivalent resistor between P2 and P4 and an equivalent inductor and an equivalent resistor between P1 and P3.

Figure 11E:
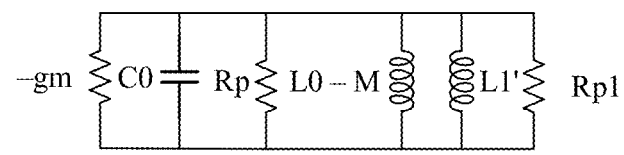
FIG. 11e is a schematic diagram of an example of an equivalent transformation result according to an embodiment of this application.

FIG. 11e shows a circuit diagram includes a negative resistor −gm and a capacitor C on a basis of a circuit diagram in FIG. 11d. In this case, two resistors Rp and Rp1, and one inductor L1' are connected in parallel to two ports of the inductor L0-M of the VCO core. Because an oscillation startup condition when the VCO works in the reverse-phase mode is not closely related to the inductor, and therefore only impact of the parallel resistors Rp and Rp1 on the oscillation startup condition in the reverse-phase mode is analyzed. In this case, an equivalent parallel resistor of the inductor L0-M is a parallel resistor of Rp and Rp1, that is $$\frac{Rp*Rp1}{Rp+Rp1}.$$

Because $$\frac{Rp*Rp1}{Rp+Rp1} < \min(Rp, Rp1),$$

and Rp1 is usually relatively small, an equivalent parallel resistance value of the inductor is greatly reduced. When $$gm*\frac{Rp*Rp1}{Rp+Rp1} \leq 1,$$

the reverse-phase mode of the core VCO will not meet the oscillation startup condition. For example, a resistance value range of the resistor R1 may be 1 to 10 ohms. It should be understood that, when a resistance value of the connection circuit between P2 and P4 and a resistance value of the connection circuit between P1 and P3 each are less than a preset threshold, the reverse-phase oscillation mode of the VCO core does not meet the oscillation startup condition.

In conclusion, when a proper R and L are connected between P2 and P4 of the two inductors and a proper R and L are connected between P1 and P3 of the two inductors, or a proper equivalent resistor and a proper equivalent inductor are connected between P2 and P4 of the two inductors and a proper equivalent resistor and a proper equivalent inductor are connected between P1 and P3 of the two inductors, the reverse-phase oscillation mode of the VCO may not meet the oscillation startup condition. In this way, the reverse-phase oscillation mode between the two VCO cores is suppressed. It should be understood that the equivalent parallel resistor herein does not include a negative resistor −gm. In this embodiment of this application, the resistor that is connected in parallel to the two ports of the inductor of the VCO core does not include the negative resistor −gm. The negative resistor mentioned in this embodiment of this application is not considered as a type of resistor. In an optional manner, short-circuiting between P2 and P4 and short-circuiting P1 and P3 can also suppress the reverse-phase oscillation mode between the two VCO cores.

It should be noted that, compared with the solutions in FIG. 5 and FIG. 6 in which the metal cable and the capacitor are connected between P2 and P4 of the two inductors and the metal cable and the capacitor are connected between P1 and P3 of the two inductors, in the solutions in FIG. 9 and FIG. 10, only the metal cable is connected between P2 and P4 of the two inductors and the metal cable is connected between P1 and P3 of the two inductors are equivalent to that a resistor Rp1 and an inductor L1' are connected in parallel to two ports of a primary inductor L0 of the VCO. In this solution, an inductance value of the metal cable cannot be offset, but an equivalent parallel resistance value of the primary inductor L0 of the VCO can still be reduced, so that the reverse-phase mode of the dual-core VCO does not meet the oscillation startup condition.

Figure 12A:
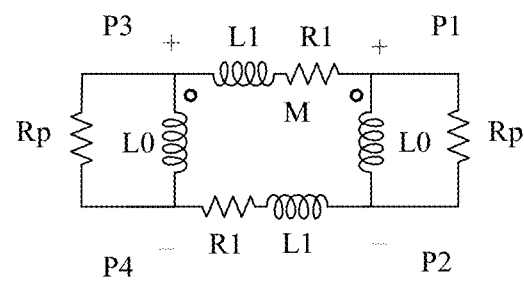
FIG. 12a is a schematic circuit diagram of an example of equivalent inductance when two VCO cores work in an in-phase mode according to an embodiment of this application.
Figure 12B:
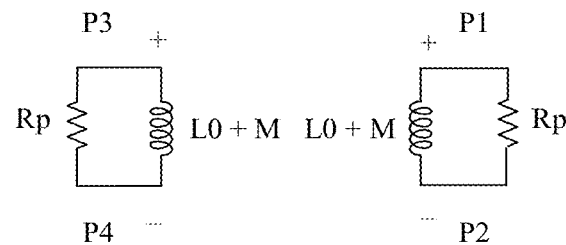
FIG. 12b is a schematic circuit diagram of an example of equivalent inductance when two VCO cores work in an in-phase mode according to an embodiment of this application.

For an in-phase mode, FIG. 12a and FIG. 12b are schematic circuit diagrams of equivalent inductance in which the two VCO cores in FIG. 10 work in an in-phase mode according to an embodiment of this application.

When the first VCO core and the second VCO core work in an in-phase mode, a phase difference between P2 and P4 is 0°, and a phase difference between P1 and P3 is 0°. It should be understood that, when the first VCO core and the second VCO core work in an in-phase mode, the phase difference between P2 and P4 is not necessarily 0°, and the phase difference between P1 and P3 is not necessarily 0°. For details, refer to the foregoing definitions of in-phase and reverse-phase. A circuit diagram shown in FIG. 12a may be equivalent to a circuit diagram shown in FIG. 12b. In this case, P2 and P4 are disconnected, and P1 and P3 are disconnected. Therefore, a connection circuit connected between P2 and P4 and a connection circuit connected between P1 and P3 each do not affect the two VCO cores in the in-phase oscillation mode. The two VCO cores are disconnected and do not interfere with each other. In this way, there is the in-phase oscillation mode between the two VCO cores. Further, the two VCO cores have only one working frequency, thereby improving stability of a working frequency of the dual-core VCO, and avoiding impact on working performance of the VCO due to existence of a plurality of oscillation modes. In an optional case, the connection circuit connected in the dual-inductor structure can also suppress the reverse-phase mode between the dual-core VCOs to some extent, but does not completely eliminate the reverse-phase mode.

An embodiment of this application provides a connection circuit between two inductors. The connection circuit includes a resistor and a capacitor. For example, the inductor and the resistor may be implemented by using a metal wire in addition to an inductor component and a resistor component. Because the metal wire has resistance and inductance, a section of metal wire may be equivalent to the resistor and the inductor. When the connection circuit is connected between two inductors, an equivalent parallel resistance value of any inductor can be greatly reduced, so that a VCO does not meet an oscillation startup condition in a reverse-phase mode, that is, a reverse-phase oscillation mode does not exist between two VCO cores. In addition, the connection circuit has no impact on the two VCO cores that work in an in-phase mode. In this way, only one in-phase oscillation mode exists between the two VCO cores, and stability of an oscillation frequency of the dual-core VCO is improved.

In an optional case, if the connection circuit makes a difference between an oscillation startup gain in the in-phase oscillation mode and an oscillation startup gain in the reverse-phase oscillation mode to be large to some extent, the in-phase oscillation mode may also fail to work, and a product of an equivalent parallel resistance value of the inductor and a resistance value of a negative resistor is not necessarily required to be less than the oscillation startup condition.

Figure 13:
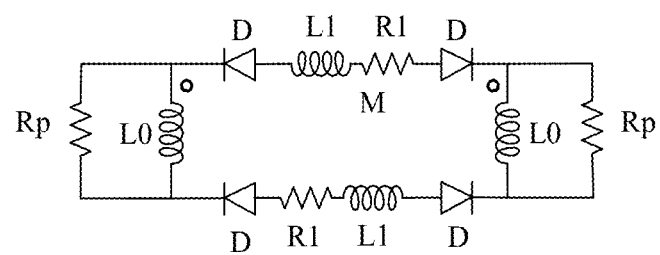
FIG. 13 is a schematic diagram of another example of a circuit structure of a connection circuit connected between two inductors according to an embodiment of this application.

FIG. 13 is a schematic diagram of another example of a circuit structure of a connection circuit connected between two inductors according to an embodiment of this application.

The connection circuit includes: a first diode, a second diode, an inductor, and a resistor. For example, the connection circuit may also include only one diode, or the diode may be replaced with a MOS field-effect transistor, a varactor, another device having a capacitive feature, or another component that functions as a capacitor. The inductor and the resistor may be implemented in a form of a metal cable or a metal wire, that is, the metal wire may be equivalent to a combination of the inductor and the resistor.

It should be understood that, the connection circuit, the first diode, and the second diode shown in FIG. 13 are equivalent to the capacitor in the embodiment corresponding to FIG. 6, and the connection circuit in FIG. 13 may also suppress a reverse-phase oscillation mode between two VCO cores. A principle is the same as that in the embodiments in FIG. 6 to FIG. 8b. Details are not described herein again.

It should be understood that the connection circuit between the inductors provided in all the embodiments of this application is applicable to a case in which there are three or more inductors.

Figure 14:
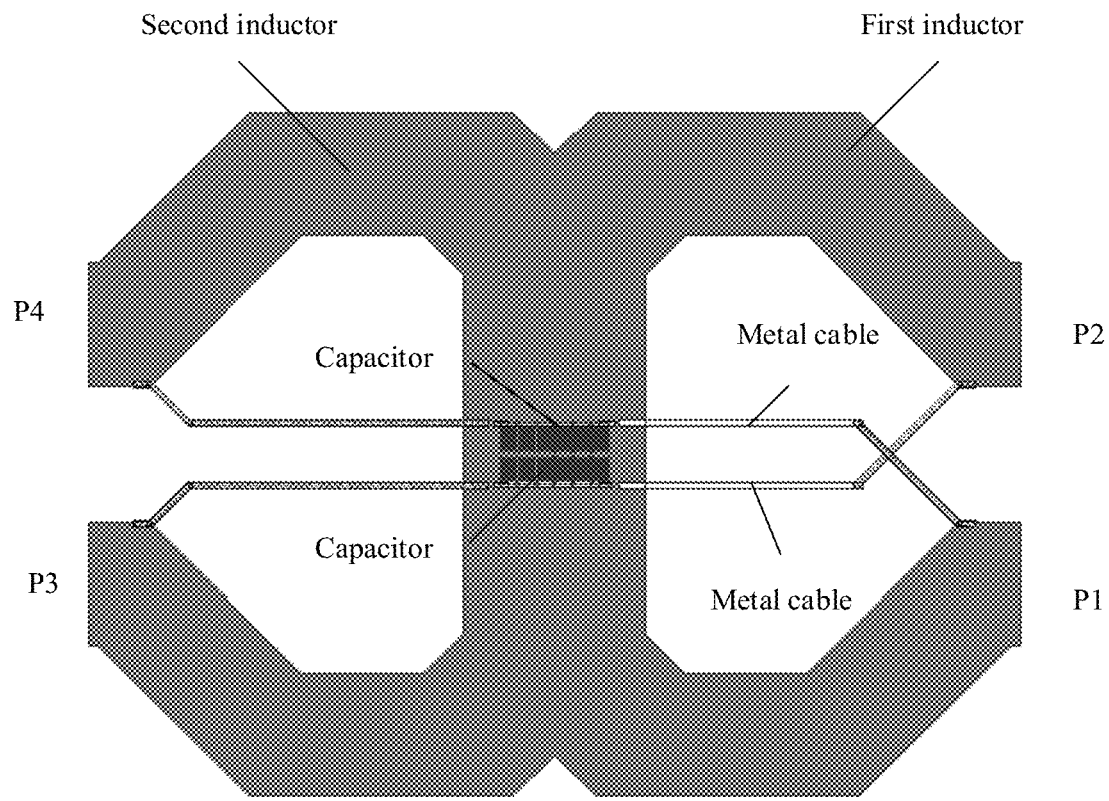
FIG. 14 is a schematic layout diagram of another example of a connection circuit connected between two inductors according to an embodiment of this application.

FIG. 14 is a schematic layout diagram of another example of a connection circuit connected between two inductors according to an embodiment of this application. In FIG. 14, a metal cable is connected between P1 and P4, and a metal cable is connected between P2 and P3. Because it has been mentioned above that the metal cable has resistance and inductance, the connection circuit is equivalent to an RLC series circuit. A connection mode of the connection circuit in this embodiment of this application can reduce an equivalent parallel resistance value of a primary inductor of a VCO core in an in-phase mode, and can suppress an in-phase oscillation mode between two VCO cores. In an optional implementation, the connection circuit makes the in-phase oscillation mode between the two VCO cores unable to work, so that only a reverse-phase oscillation mode exists between the two VCO cores, and correspondingly, only negative mutual inductance exists between the two inductors. For a principle of reducing the equivalent parallel resistance value and making an oscillation frequency of the in-phase oscillation mode of the VCO core not meet an oscillation startup condition, refer to descriptions in the embodiments in FIG. 7a to FIG. 8b. Details are not described herein again. It should be understood that, when a resistance value of the connection circuit between P2 and P3 and a resistance value of the connection circuit between P1 and P4 each are less than a preset threshold, the in-phase oscillation mode of the VCO core does not meet the oscillation startup condition.

Figure 15:
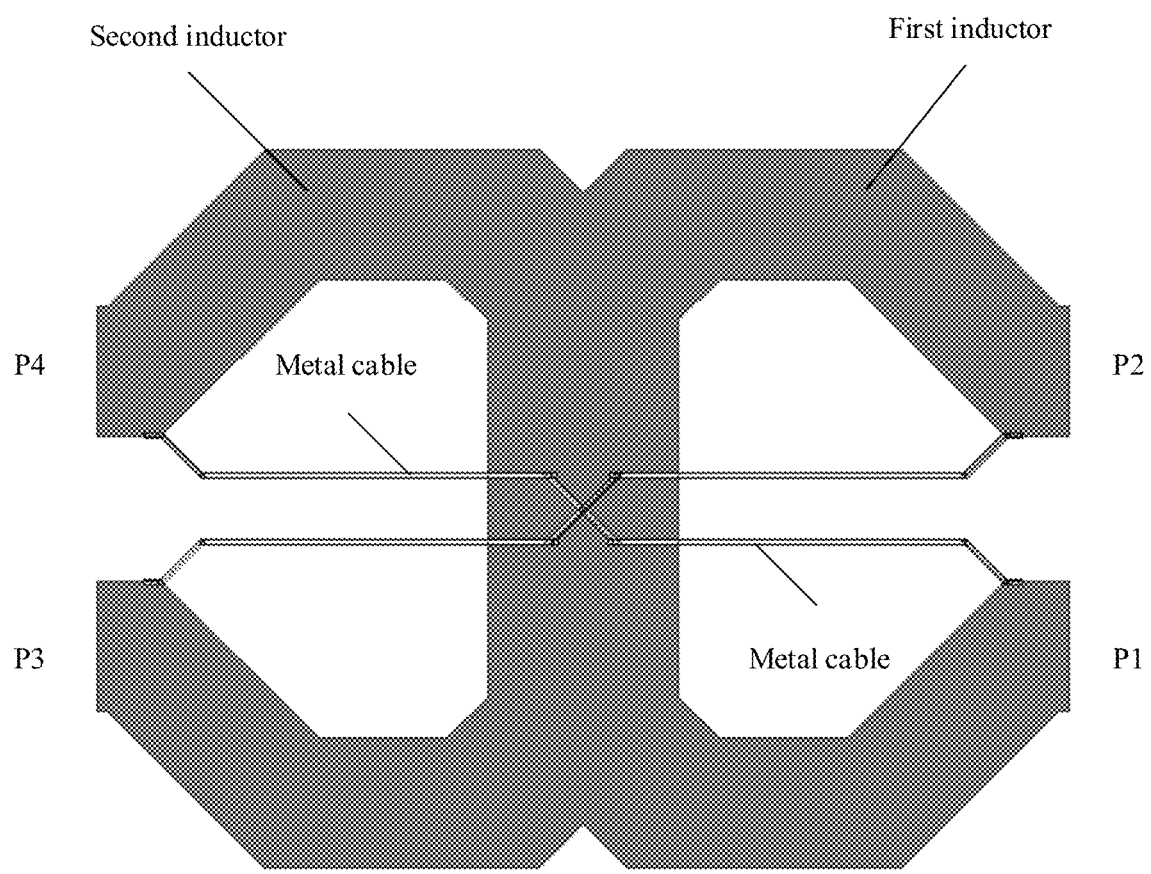
FIG. 15 is a schematic layout diagram of another example of a connection circuit connected between two inductors according to an embodiment of this application.

FIG. 15 is a schematic layout diagram of another example of a connection circuit connected between two inductors according to an embodiment of this application. In FIG. 15, a metal cable is connected between P1 and P4, and a metal cable is connected between P2 and P3. In this case, the connection circuit is equivalent to an RL series circuit. In an optional case, a superconducting material may also be connected between P1 and P4 and a superconducting material may also be connected between P2 and P3. In this case, it is equivalent to that P1 and P4 are short-circuited, and P2 and P3 are short-circuited. Similar to the connection circuit in FIG. 14, a connection mode of the connection circuit in FIG. 15 can also reduce an equivalent parallel resistance value of a primary inductor of a VCO core in an in-phase mode, and can suppress an in-phase oscillation mode between two VCO cores. In an optional implementation, the connection circuit makes the in-phase oscillation mode between the two VCO cores unable to work, so that only a reverse-phase oscillation mode exists between the two VCO cores, and correspondingly, only negative mutual inductance exists between the two inductors. For a principle of reducing the equivalent parallel resistance value and making an oscillation frequency of the in-phase oscillation mode of the VCO core not meet an oscillation startup condition, refer to descriptions in the embodiments in FIG. 11a to FIG. 12b. Details are not described herein again. It should be understood that, when a resistance value of the connection circuit between P2 and P3 and a resistance value of the connection circuit between P1 and P4 each are less than a preset threshold, the in-phase oscillation mode of the VCO core does not meet the oscillation startup condition.

An embodiment of this application provides an integrated circuit including a connection circuit. The connection circuit is connected between a port of a first inductor and a port of a second inductor. The connection circuit makes an electrical connection or a physical connection exist between the first inductor and the second inductor. The connection circuit can reduce or suppress one of oscillation modes between the first resonant circuit and the second resonant circuit, so that there is only one oscillation mode between the first resonant circuit and the second resonant circuit, thereby improving stability of a working frequency of the resonant circuit.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A dual-core oscillator, comprising:
   a first oscillator core, wherein the first oscillator core comprises a first inductor, and the first inductor comprises a first port;
   a second oscillator core, wherein the second oscillator core comprises a second inductor, and the second inductor comprises a second port;
   a first connection circuit connected to the first port and the second port, wherein the first connection circuit provides an electrical connection between the first port and the second port, and wherein the first connection circuit comprises a resistor, an inductor, a first diode, and a second diode; and
   wherein the first inductor and the second inductor are located at a same metal layer, and the first inductor and the second inductor share at least a portion of metal trace.

2. The dual-core oscillator according to claim 1, wherein the dual-core oscillator further comprises a second connection circuit;
   wherein the first inductor comprises a third port, and the first port and the third port are differential ports;
   wherein the second inductor comprises a fourth port, and the second port and the fourth port are differential ports; and
   wherein the second connection circuit is connected to the third port and the fourth port, and wherein the second connection circuit provides an electrical connection between the third port and the fourth port.

3. The dual-core oscillator according to claim 2, wherein the second connection circuit is one of a metal connection wire or a superconducting material.

4. The dual-core oscillator according to claim 2, wherein the second connection circuit comprises at least one of a resistor, a capacitor, or an inductor.

5. The dual-core oscillator according to claim 2, wherein both the two ports connected to any one of the first connection circuit and the second connection circuit are input ports of signals or output ports of the signals.

6. The dual-core oscillator according to claim 5, wherein the signals comprise at least one of a current signal or a voltage signal.

7. The dual-core oscillator according to claim 2, wherein any one of the first connection circuit or the second connection circuit suppresses in-phase oscillation mode or reverse-phase oscillation mode of the dual-core oscillator.

8. The dual-core oscillator according to claim 1, wherein a coil of the first inductor and a coil of the second inductor are located at a same metal layer, and overlap each other in a layout.

9. The dual-core oscillator according to claim 1, wherein projections of a coil of the first inductor and a coil of the second inductor at least partially overlap in a vertical direction along a layout.

10. The dual-core oscillator according to claim 1, wherein the first inductor and the second inductor are mutual coupled.

11. The dual-core oscillator according to claim 1, wherein the first connection circuit is one of a metal connection wire or a superconducting material.

12. The dual-core oscillator according to claim 1, wherein the first connection circuit comprises a capacitor.

13. The dual-core oscillator according to claim 12, wherein the capacitor comprises any one of an on-chip capacitor, a diode, a metal oxide semiconductor (MOS) transistor, or a varactor.

14. The dual-core oscillator according to claim 12, wherein a resistance value of the resistor is less than a first preset threshold, and the first oscillator core and the second oscillator core do not meet an oscillation startup condition at a reverse-phase oscillation frequency or an in-phase oscillation frequency.

15. The dual-core oscillator according to claim 1, wherein the first oscillator core and the second oscillator core are digitally controlled oscillators (DCOs).

16. The dual-core oscillator according to claim 1, wherein the first oscillator core and the second oscillator core are voltage controlled oscillators (VCOs).

17. The dual-core oscillator according to claim 1, wherein:
   when flow directions of signals in the first inductor and the second inductor enable a mutual inductance between the first inductor and the second inductor, at a same moment, both the first port and the second port are input ports of the signals, or both the first port and the second port are output ports of the signals.

18. The dual-core oscillator according to claim 1, wherein the first oscillator core further comprises a first negative resistor and a first parallel resistor, the second oscillator core further comprises a second negative resistor and a second parallel resistor, the first negative resistor and the first parallel resistor are connected in parallel to two ports of the first inductor, and the second negative resistor and the second parallel resistor are connected in parallel to two ports of the second inductor.

19. A phase locked loop, comprising:
   a dual-core oscillator, wherein the dual-core oscillator comprises:
      a first oscillator core, wherein the first oscillator core comprises a first inductor, and the first inductor comprises a first port;
      a second oscillator core, wherein the second oscillator core comprises a second inductor, and the second inductor comprises a second port; and
      a first connection circuit connected to the first port and the second port, wherein the first connection circuit is configured to provide an electrical connection between the first port and the second port, and wherein the first connection circuit comprises a resistor, an inductor, a first diode, and a second diode; and
      wherein the first inductor and the second inductor are located at a same metal layer, and the first inductor and the second inductor share at least a portion of metal trace.

20. The phase locked loop according to claim 19, wherein the dual-core oscillator further comprises a second connection circuit;
   wherein the first inductor comprises a third port, and the first port and the third port are differential ports;
   wherein the second inductor comprises a fourth port, and the second port and the fourth port are differential ports; and
   wherein the second connection circuit is connected to the third port and the fourth port, and wherein the second connection circuit provides an electrical connection between the third port and the fourth port.

* * * * *